US012727216B2

(12) United States Patent
Chen et al.

(10) Patent No.: US 12,727,216 B2
(45) Date of Patent: Sep. 1, 2026

(54) TRANSISTOR PROTECTION LAYERS AND METHODS OF FORMING THE SAME

(71) Applicant: Taiwan Semiconductor Manufacturing Co., Ltd., Hsinchu (TW)

(72) Inventors: Yu-Ting Chen, Hsinchu (TW); Tai-Jung Kuo, Hsinchu (TW); Mu-Chieh Chang, Zhubei City (TW); Zhen-Cheng Wu, Hsinchu (TW); Sung-En Lin, Xionglin Township (TW); Tze-Liang Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 378 days.

(21) Appl. No.: 18/479,580

(22) Filed: Oct. 2, 2023

(65) Prior Publication Data

US 2025/0113566 A1 Apr. 3, 2025

(51) Int. Cl.

*H10D 62/10* (2025.01)
*H10D 30/01* (2025.01)
*H10D 30/43* (2025.01)
*H10D 30/67* (2025.01)
*H10D 64/01* (2025.01)

(Continued)

(52) U.S. Cl.

CPC ......... *H10D 62/121* (2025.01); *H10D 30/014* (2025.01); *H10D 30/43* (2025.01); *H10D 30/6735* (2025.01); *H10D 30/6757* (2025.01); *H10D 64/017* (2025.01);

(Continued)

(58) Field of Classification Search

CPC .... H10D 62/121; H10D 30/014; H10D 30/43; H10D 30/6735; H10D 30/6757; H10D 64/017; H10D 84/0167; H10D 84/038; H10D 84/85; H10D 62/151; H10D 62/822; H01L 21/823807; H01L 27/092; H01L 29/0673; H01L 29/42392; H01L 29/66439; H01L 29/66545; H01L 29/775; H01L 29/78696

See application file for complete search history.

(56) References Cited

U.S. PATENT DOCUMENTS 9,209,247 B2 12/2015 Colinge et al.
9,236,267 B2 1/2016 De et al.

(Continued)

FOREIGN PATENT DOCUMENTS

TW 202335070 A 9/2023

*Primary Examiner* — Andres Munoz
(74) *Attorney, Agent, or Firm* — Slater Matsil, LLP

(57) ABSTRACT

Various embodiments include protection layers for a transistor and methods of forming the same. In an embodiment, a method includes: exposing a semiconductor nanostructure, a dummy nanostructure, and an isolation region by removing a dummy gate; increasing a deposition selectivity between a top surface of the semiconductor nanostructure and a top surface of the isolation region relative a selective deposition process; depositing a protection layer on the top surface of the isolation region by performing the selective deposition process; removing the dummy nanostructure by selectively etching a dummy material of the dummy nanostructure at a faster rate than a protection material of the protection layer; and forming a gate structure around the semiconductor nanostructure.

20 Claims, 24 Drawing Sheets

(51) Int. Cl.

*H10D 84/01* (2025.01)
*H10D 84/03* (2025.01)
*H10D 84/85* (2025.01)

(52) U.S. Cl.

CPC ....... *H10D 84/0167* (2025.01); *H10D 84/038* (2025.01); *H10D 84/85* (2025.01)

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 * | 3/2017 | Ching | H10D 30/6713 |
| 11,127,819 | B2 * | 9/2021 | Liaw | H10D 84/0128 |
| 12,322,647 | B2 | 6/2025 | Lin et al. | |
| 2021/0202756 | A1 * | 7/2021 | Chang | H10D 30/6757 |
| 2022/0037498 | A1 * | 2/2022 | Lin | H10D 30/6735 |
| 2022/0173213 | A1 * | 6/2022 | Lan | H10D 30/62 |
| 2024/0120236 | A1 * | 4/2024 | Kuo | H10W 10/014 |

* cited by examiner 66
64
66
64
66
64
62
62
62
62
50
50N
50P

50N/50P

50N/50P
122
$NH_2$
66
64
62
70
128
50

92
112
116
114
102
98

50N/50P
122
130
66
62
70
128
50
NH2
92
112
116
114
102
98

50N/50P
144
142
132
134
66
114
148
150
102
92
146
98
62
50
128
70

TRANSISTOR PROTECTION LAYERS AND METHODS OF FORMING THE SAME

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-20B are views of intermediate stages in the manufacturing of nanostructure-FETs, in accordance with some embodiments.

FIGS. 22A-23B are views of intermediate stages in the manufacturing of nanostructure-FETs, in accordance with some other embodiments.

DETAILED DESCRIPTION

Figure 1:
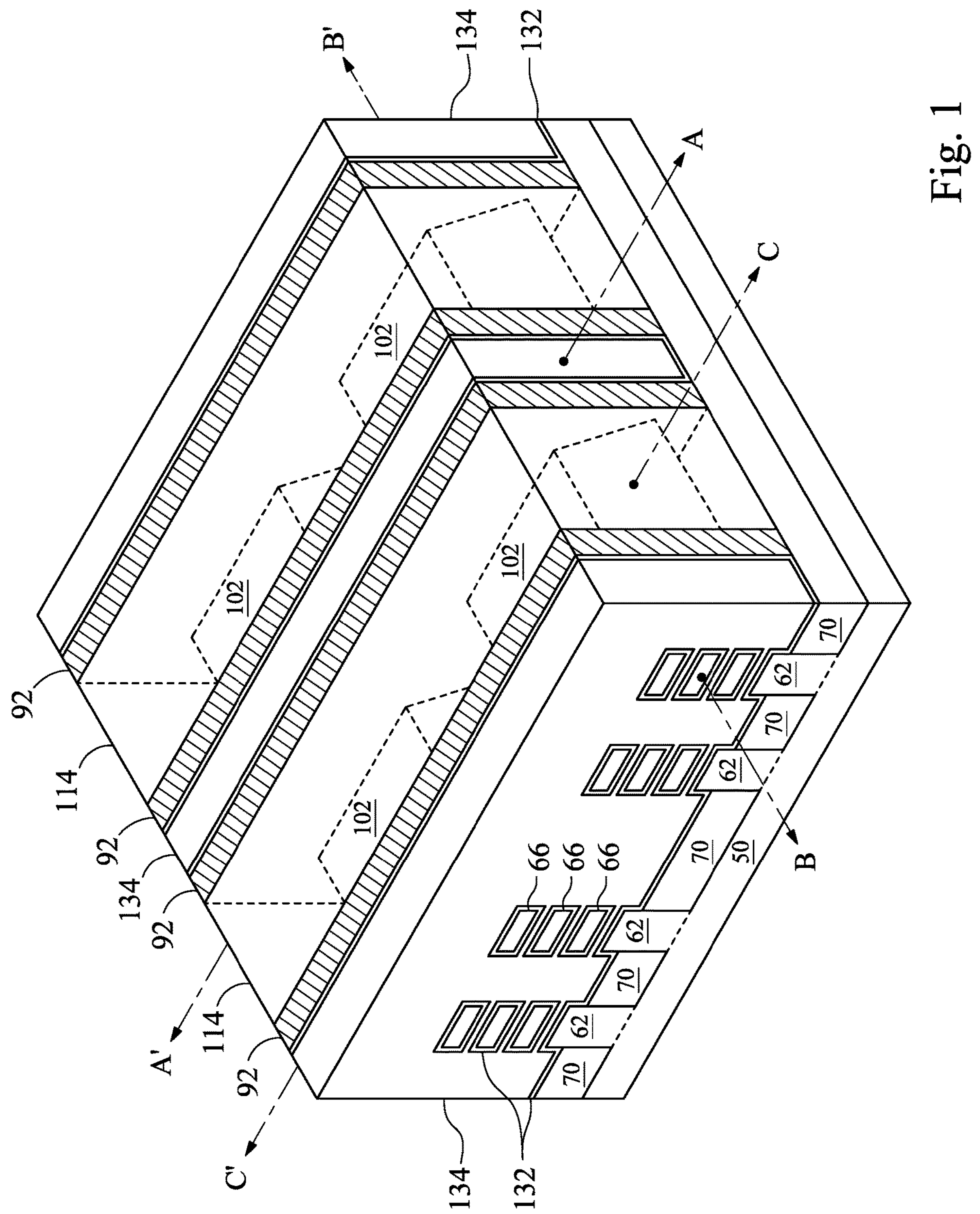
FIG. 1 illustrates an example of a nanostructure field-effect transistor (nanostructure-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, during a gate replacement process, protection layers are selectively deposited on isolation regions but not on exposed semiconductor nanostructures. Specifically, after dummy gates are removed to expose the isolation regions and the semiconductor nanostructures, the protection layers are selectively deposited on the isolation regions. Dangling amino groups or inhibition layers are selectively formed on the top surfaces of the semiconductor nanostructures, which inhibit deposition of the protection layers so that the protection layers are selectively deposited on the isolation regions but not on the semiconductor nanostructures. The protection layers protect the isolation regions from etching losses during a process for removing dummy nanostructures to expose the top and bottom surfaces of the semiconductor nanostructures. Because the protection layers are not formed on the semiconductor nanostructures, the top surfaces of the upper semiconductor nanostructures may be more easily exposed in subsequent processing before gate structures are formed around the semiconductor nanostructures. Over-etching of the semiconductor nanostructures may thus be avoided, improving device reliability.

FIG. 1 illustrates an example of nanostructure-FETs (e.g., nanowire FETs, nanosheet FETs, multi bridge channel (MBC) FETs, nanoribbon FETs, gate-all-around (GAA) FETs, or the like), in accordance with some embodiments. FIG. 1 is a three-dimensional view, where some features of the nanostructure-FETs are omitted for illustration clarity.

The nanostructure-FETs include semiconductor nanostructures 66 (e.g., nanosheets, nanowires, or the like) over semiconductor fins 62 on a substrate 50 (e.g., a semiconductor substrate), with the semiconductor nanostructures 66 being semiconductor features that act as channel regions for the nanostructure-FETs. Isolation regions 70, such as shallow trench isolation (STI) regions, are disposed between adjacent semiconductor fins 62, which may protrude above and from between neighboring isolation regions 70. The semiconductor nanostructures 66 are disposed over and between adjacent isolation regions 70. Although the isolation regions 70 are described/illustrated as being separate from the substrate 50, as used herein, the term "substrate" may refer to the semiconductor substrate alone or a combination of the semiconductor substrate and the isolation regions. Additionally, although a bottom portion of the semiconductor fins 62 are illustrated as being single, continuous materials with the substrate 50, the bottom portions of the semiconductor fins 62 and/or the substrate 50 may include a single material or a plurality of materials.

Gate dielectrics 132 are over top surfaces of the semiconductor fins 62 and along top surfaces, sidewalls, and bottom surfaces of the semiconductor nanostructures 66. Gate electrodes 134 are over the gate dielectrics 132. Source/drain regions 102 are disposed on the semiconductor fins 62 at opposing sides of the gate dielectrics 132 and the gate electrodes 134. Source/drain region(s) 102 may refer to a source or a drain, individually or collectively dependent upon the context. The source/drain regions 102 may be shared between various ones of the semiconductor nanostructures 66. For example, adjacent source/drain regions 102 may be electrically connected, such as through coalescing the source/drain regions 102 by epitaxial growth, or through coupling the source/drain regions 102 with a same contact. An inter-layer dielectric (ILD) 114 is formed over the source/drain regions 102.

FIG. 1 further illustrates reference cross-sections that are used in later figures. Cross-section A-A' is along a longitudinal axis of a gate electrode 134. Cross-section B-B' is perpendicular to cross-section A-A' and is along a longitudinal axis of a semiconductor fin 62 of a nanostructure-FET and in a direction of, for example, a current flow between the source/drain regions 102 of the nanostructure-FET. Cross-section C-C' is parallel to cross-section A-A' and extends through source/drain regions 102 of the nanostructure-FETs. Subsequent figures refer to these reference cross-sections for clarity.

FIGS. 2-20B are views of intermediate stages in the manufacturing of nanostructure-FETs, in accordance with some embodiments. FIGS. 2, 3, 4, 5, and 6 are three-dimensional views showing a similar three-dimensional view as FIG. 1. FIGS. 7A, 8A, 9A, 10A, 11A, 12A, 13A, 14A, 15A, 16A, 17A, 18A, 19A, and 20A illustrate cross-sectional views along a similar cross-section as reference cross-section A-A' in FIG. 1. FIGS. 7B, 8B, 9B, 10B, 11B, 12B, 13B, 14B, 15B, 16B, 17B, 18B, 19B, and 20B illustrate cross-sectional views along a similar cross-section as reference cross-section B-B' in FIG. 1. FIGS. 10C and 10D illustrate cross-sectional views along a similar cross-section as reference cross-section C-C' in FIG. 1. The nanostructure-FETs are shown in FIGS. 20A-20B.

Figure 2:
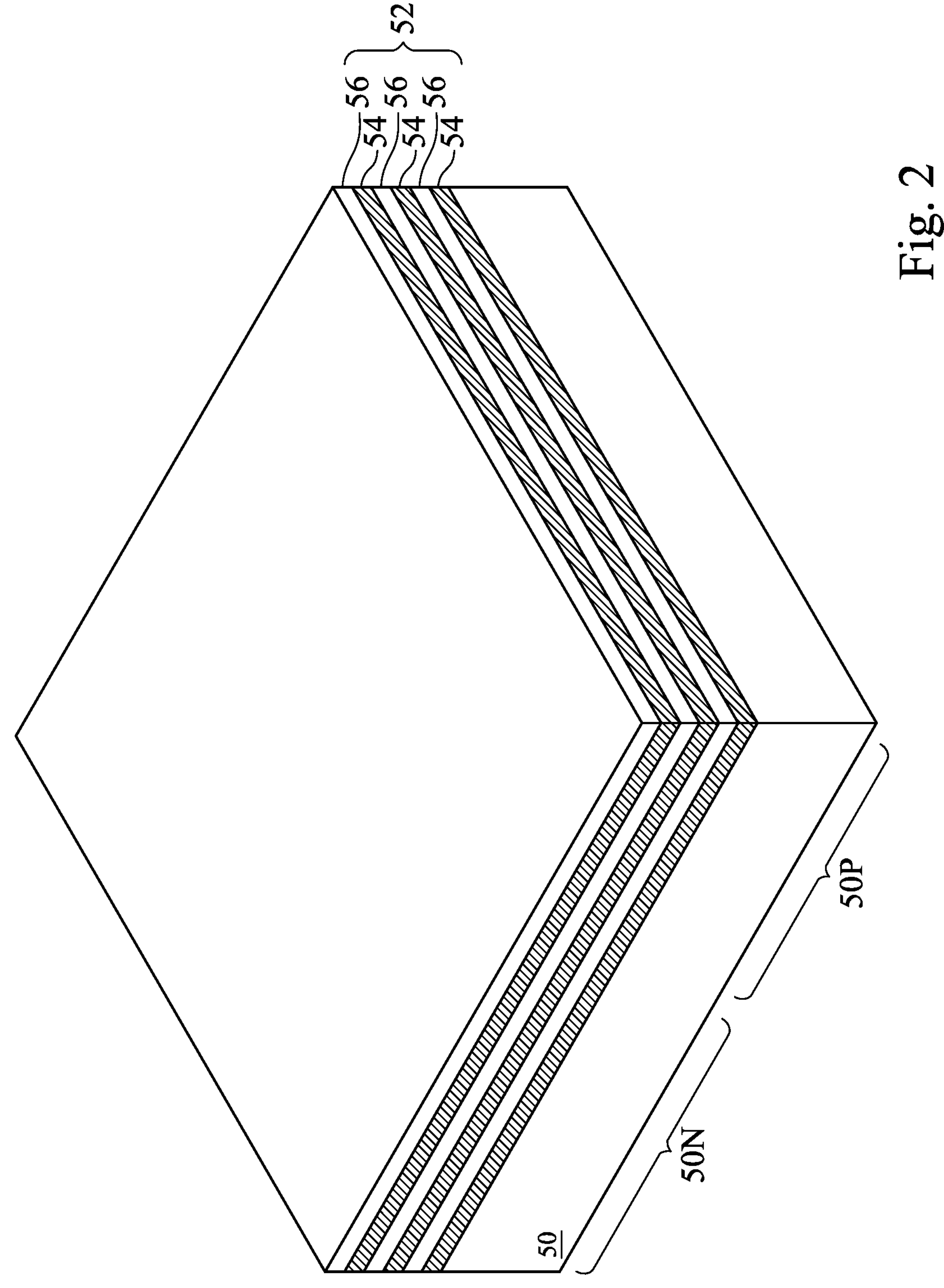

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nanostructure-FETs, and the p-type region 50P can be for forming p-type devices, such as PMOS transistors, e.g., p-type nanostructure-FETs. The n-type region 50N may (or may not) be physically separated (not separately illustrated) from the p-type region 50P, and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

A multi-layer stack 52 is formed over the substrate 50. The multi-layer stack 52 includes alternating dummy layers 54 and semiconductor layers 56. In the illustrated embodiment, and as subsequently described in greater detail, the dummy layers 54 will be removed and the semiconductor layers 56 will patterned to form channel regions for the nanostructure-FETs in the n-type region 50N and the p-type region 50P.

The dummy layers 54 are formed of a dummy material, and the semiconductor layers 56 are formed of one or more semiconductor material(s). The dummy material of the dummy layers 54 may be a dielectric material or may be a semiconductor material. The dummy material may be silicon oxide, silicon oxynitride, silicon oxycarbonitride, or the like. The semiconductor material(s) may each be selected from the candidate semiconductor materials of the substrate 50. In some embodiments, the semiconductor layers 56 in the n-type region 50N and the p-type region 50P are formed of the same semiconductor material, which may be suitable for both n-type and p-type devices. In some embodiments, the dummy material of the dummy layers 54 is silicon-germanium or silicon oxide, and the semiconductor material of the semiconductor layers 56 is silicon. Thus, the channel regions in both the n-type region 50N and the p-type region 50P may have a same material composition (e.g., silicon or another semiconductor material) and may be formed simultaneously. In another embodiment, the semiconductor layers 56 in the p-type region 50P are formed of a first semiconductor material while the semiconductor layers 56 in the n-type region 50N are formed of a second semiconductor material. The first semiconductor material may be suitable for p-type devices, such as silicon-germanium (e.g., $Si_xGe_{1-x}$, where x can be in the range of 0 to 1), pure germanium, or the like. The second semiconductor material may be suitable for n-type devices, such as silicon, silicon carbide, or the like. The dummy material of the dummy layers 54 has a high etching selectivity from the semiconductor material (s) of the semiconductor layers 56. As such, the dummy material of the dummy layers 54 may be removed at a faster rate than the semiconductor material(s) of the semiconductor layers 56 in subsequent processing.

The multi-layer stack 52 is illustrated as including a specific number of the dummy layers 54 and a specific number of the semiconductor layers 56. It should be appreciated that the multi-layer stack 52 may include any number of the dummy layers 54 and the semiconductor layers 56. Each of the layers of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like.

Figure 3:
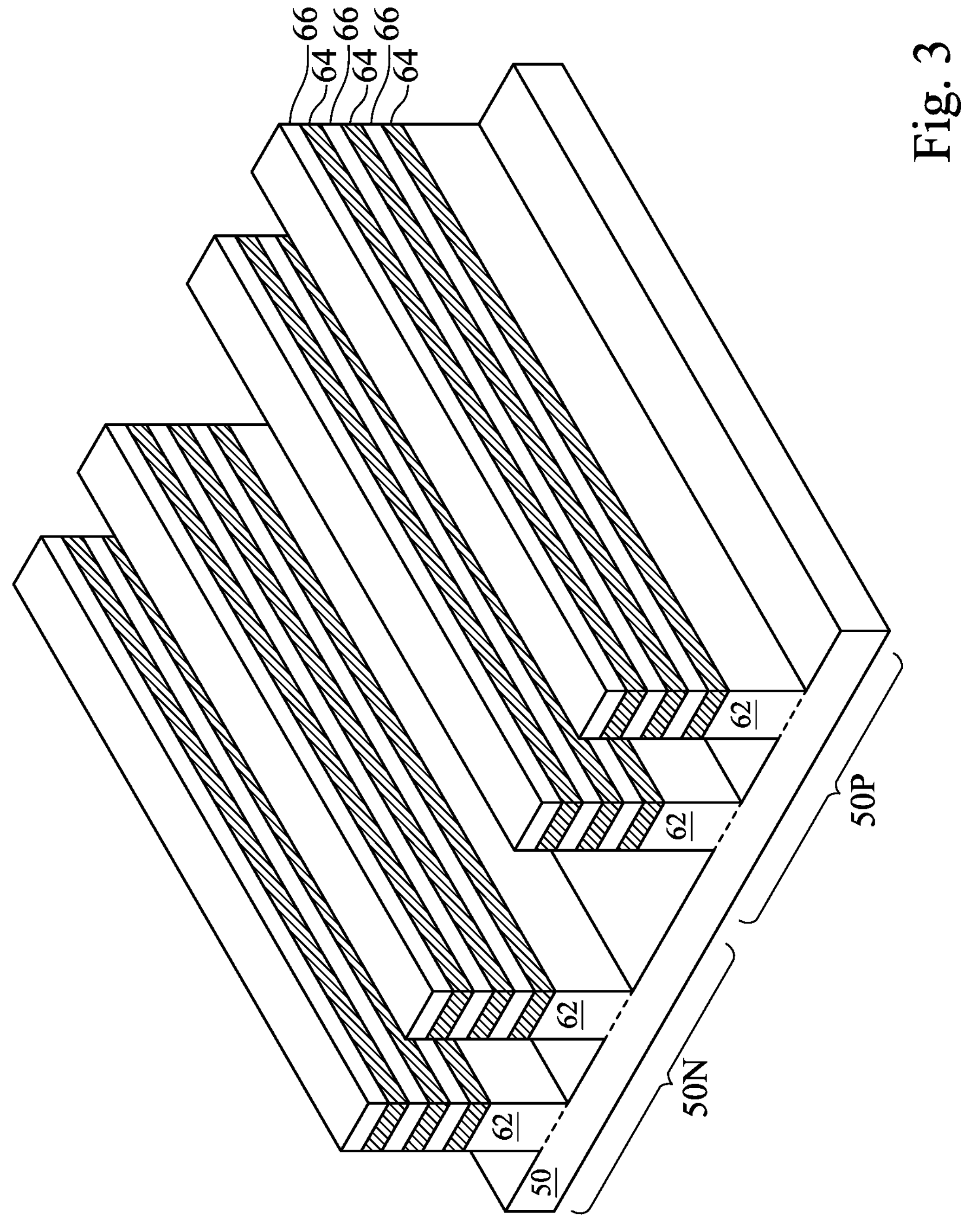

In FIG. 3, semiconductor fins 62 are formed in the substrate 50 and nanostructures 64, 66 (including dummy nanostructures 64 and semiconductor nanostructures 66) are formed in the multi-layer stack 52. In some embodiments, the nanostructures 64, 66 and the semiconductor fins 62 may be formed in the multi-layer stack 52 and the substrate 50, respectively, by etching trenches in the multi-layer stack 52 and the substrate 50. The etching may be any acceptable etch process, such as a reactive ion etch (RIE), neutral beam etch (NBE), the like, or a combination thereof. The etching may be anisotropic. Forming the nanostructures 64, 66 by etching the multi-layer stack 52 may define the dummy nanostructures 64 from the dummy layers 54 and may define the semiconductor nanostructures 66 from the semiconductor layers 56.

The semiconductor fins 62 and the nanostructures 64, 66 may be patterned by any suitable method. For example, the semiconductor fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the semiconductor fins 62 and the nanostructures 64, 66.

The nanostructures 64, 66 are illustrated as having substantially equal widths in both the n-type region 50N and the p-type region 50P. In some embodiments, the widths of the nanostructures 64, 66 in the n-type region 50N may be different from the width of the nanostructures 64, 66 in the p-type region 50P. Further, while each of the semiconductor fins 62 and the nanostructures 64, 66 are illustrated as having a constant width throughout, in other embodiments, the semiconductor fins 62 and/or the nanostructures 64, 66 may have tapered sidewalls such that a width of each of the semiconductor fins 62 and/or the nanostructures 64, 66 continuously increases in a direction towards the substrate 50. In such embodiments, each of the nanostructures 64, 66 may have a different width and be trapezoidal in shape.

Figure 4:
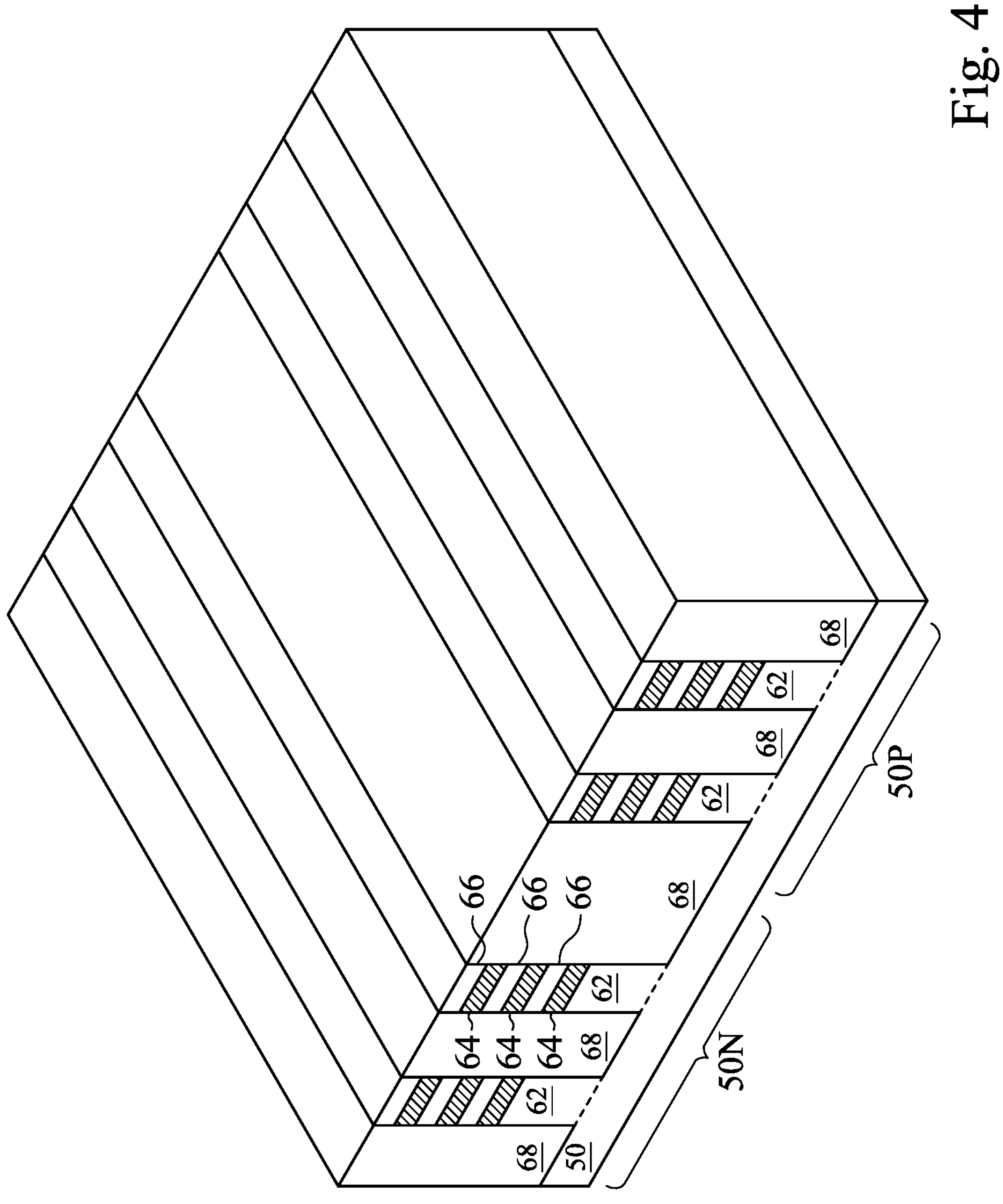

In FIG. 4, an insulation material 68 is formed over the substrate 50 and between the semiconductor fins 62 and the nanostructures 64, 66. The insulation material 68 may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. The insulation material 68 may be formed of a carbon-free dielectric material. In some embodiments, the insulation material 68 includes silicon oxide formed by an FCVD process. An annealing process may be performed once the insulation material 68 is formed. Although the insulation material 68 is illustrated as a single layer, some embodiments may utilize multiple layers. For example, in some embodiments a liner (not separately illustrated) may first be formed along a surface of the substrate 50, the semiconductor fins 62, and the nanostructures 64, 66. Thereafter, a fill material, such as one of the previously described insulation materials may be formed over the liner.

The insulation material 68 may be deposited over the semiconductor fins 62 and nanostructures 64, 66 such that excess insulation material 68 covers the nanostructures 64, 66. A removal process is then applied to the insulation material 68 to remove excess insulation material 68 over the nanostructures 64, 66. In some embodiments, a planarization process such as a chemical mechanical polish (CMP), an etch-back process, combinations thereof, or the like may be utilized. The planarization process exposes the nanostructures 64, 66 such that top surfaces of the nanostructures 64, 66 and the insulation material 68 are substantially coplanar (within process variations) after the planarization process is complete.

Figure 5:
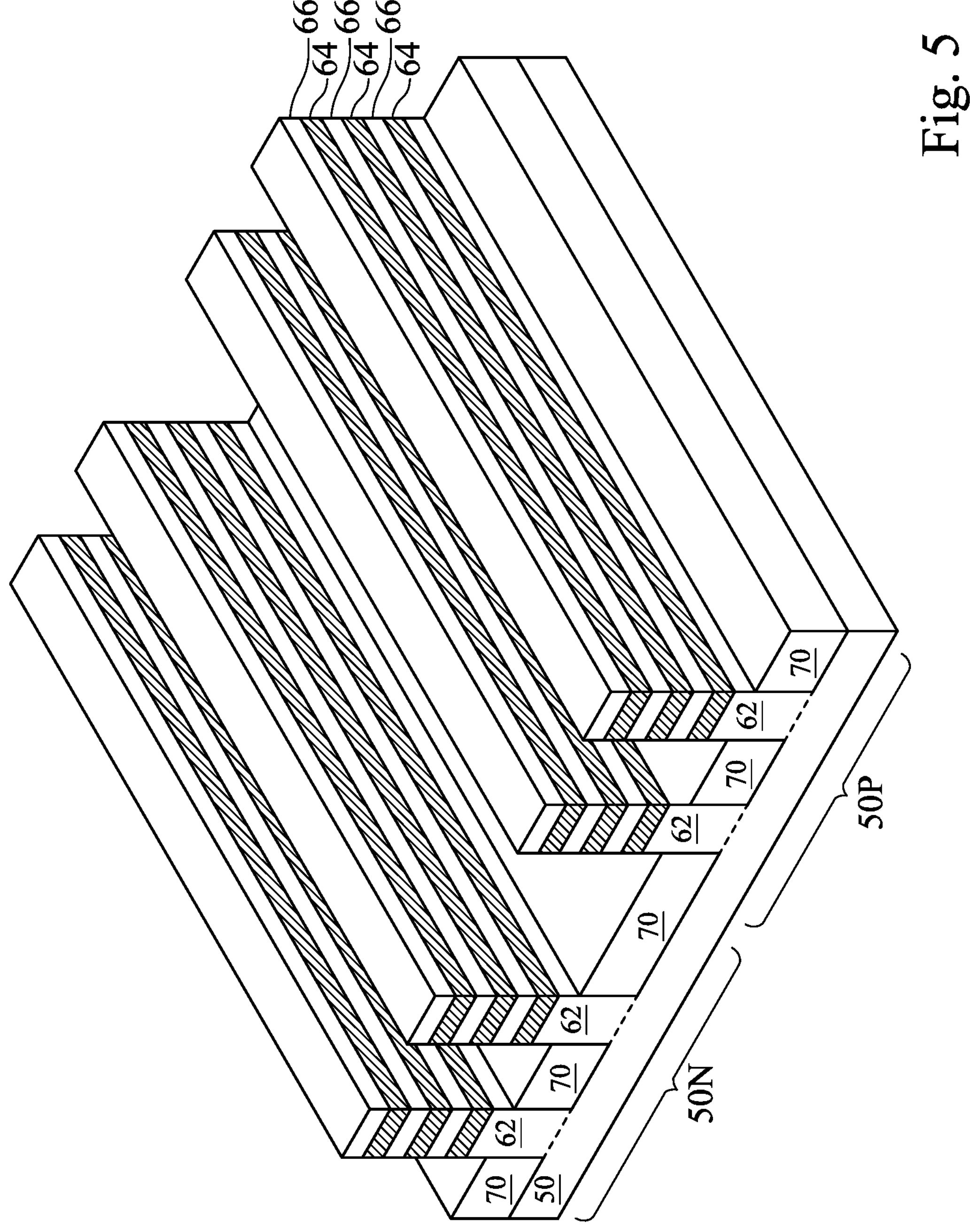

In FIG. 5, the insulation material 68 is recessed to form isolation regions 70. The isolation regions 70 are adjacent the semiconductor fins 62. The insulation material 68 is recessed such that upper portions of the semiconductor fins 62 and/or the nanostructures 64, 66 protrude from between neighboring isolation regions 70. The upper portions of the semiconductor fins 62 and/or the nanostructures 64, 66 are above the isolation regions 70. Further, the top surfaces of the isolation regions 70 may have a flat surface as illustrated, a convex surface, a concave surface (such as dishing), or a combination thereof. The top surfaces of the isolation regions 70 may be formed flat, convex, and/or concave by an appropriate etch. The isolation regions 70 may be recessed using any acceptable etching process, such as one that is selective to the material of the insulation material 68 (e.g., selectively etches the material of the insulation material 68 at a faster rate than the materials of the semiconductor fins 62 and the nanostructures 64, 66). For example, an oxide removal using, for example, dilute hydrofluoric (dHF) acid may be used. In some embodiments, the etching is anisotropic.

The previously described process is just one example of how the semiconductor fins 62 and the nanostructures 64, 66 may be formed. In some embodiments, the semiconductor fins 62 and/or the nanostructures 64, 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the semiconductor fins 62 and/or the nanostructures 64, 66. The epitaxial structures may include the previously described alternating semiconductor materials, such as the dummy material and the semiconductor material. In some embodiments where epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the semiconductor fins 62 and/or the nanostructures 64, 66. In embodiments with different well types, different implant steps for the n-type region 50N and the p-type region 50P may be achieved using a photoresist or other mask (not separately illustrated). For example, a photoresist may be formed over the semiconductor fins 62, the nanostructures 64, 66, and the isolation regions 70 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from $10^{13}$ atoms/cm$^3$ to $10^{14}$ atoms/cm$^3$. After the implant, the photoresist is removed, such as by any acceptable ashing process.

Following or prior to the implanting of the p-type region 50P, a photoresist or other mask (not separately illustrated) is formed over the semiconductor fins 62, the nanostructures 64, 66, and the isolation regions 70 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from $10^{13}$ atoms/cm$^3$ to $10^{14}$ atoms/cm$^3$. After the implant, the photoresist may be removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown, the epitaxially grown materials may be in situ doped during growth, which may obviate the implantations, although in situ and implantation doping may be used together.

Figure 6:
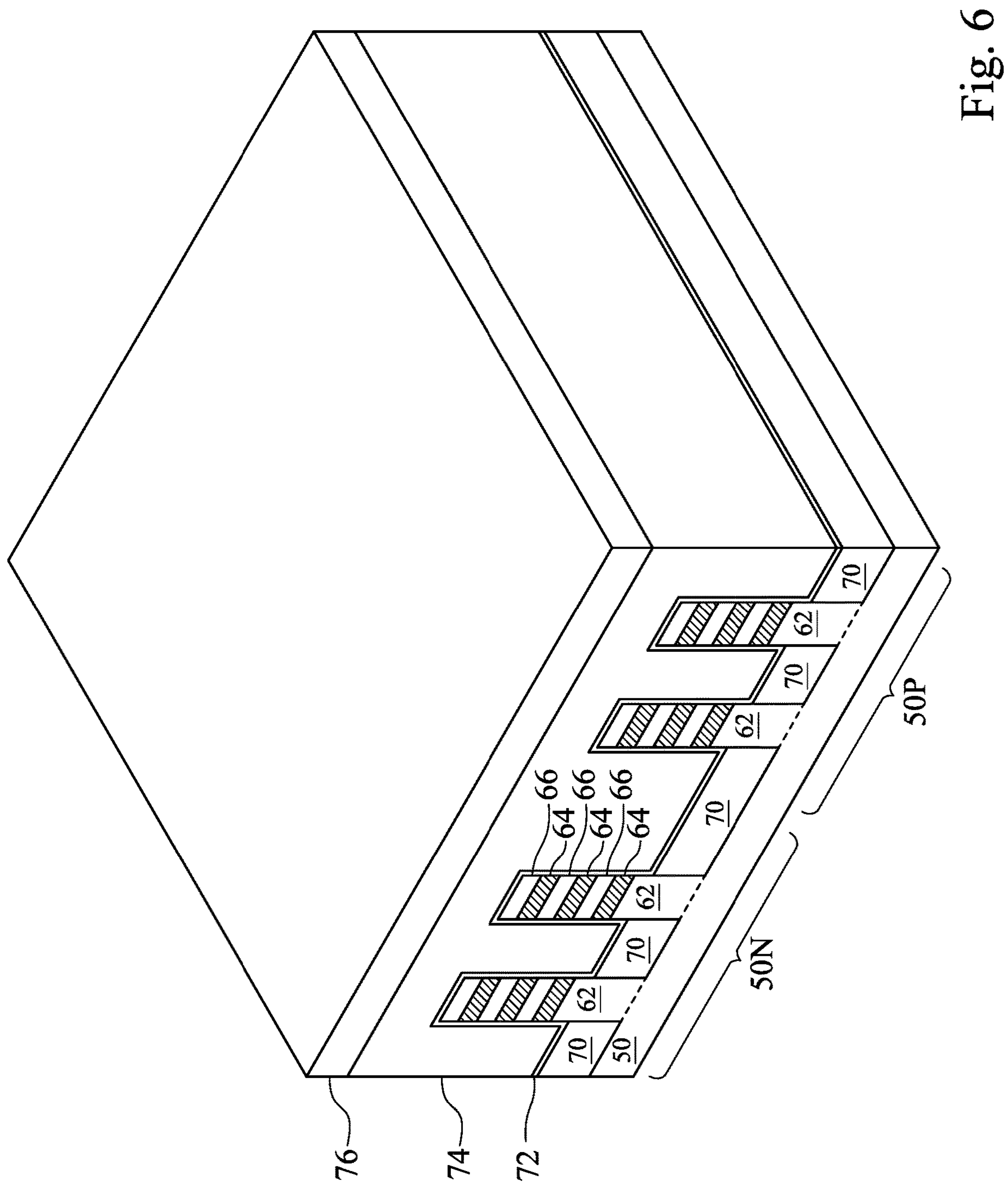

In FIG. 6, a dummy dielectric layer 72 is formed on the semiconductor fins 62 and/or the nanostructures 64, 66. The dummy dielectric layer 72 may be formed of silicon oxide, silicon nitride, a combination thereof, or the like, which may be deposited or thermally grown according to acceptable techniques. A dummy gate layer 74 is formed over the dummy dielectric layer 72. The dummy gate layer 74 may be deposited over the dummy dielectric layer 72 and then planarized, such as by a chemical mechanical polish (CMP). The dummy gate layer 74 may be formed of a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The material of the dummy gate layer 74 may be deposited by CVD, physical vapor deposition (PVD), sputter deposition, or other techniques for depositing the selected material. The dummy gate layer 74 may be formed of other materials that have a high etching selectivity from the etching of insulation materials, e.g., the isolation regions 70 and/or the dummy dielectric layer 72. A mask layer 76 may be formed over the dummy gate layer 74. The mask layer 76 may be formed of a dielectric material such as silicon nitride, silicon oxynitride, or the like. In this example, a single dummy gate layer 74 and a single mask layer 76 are formed across the n-type region 50N and the p-type region 50P. In the illustrated embodiment, the dummy dielectric layer 72 covers the isolation regions 70, such that the dummy dielectric layer 72 extends between the dummy gate layer 74 and the isolation regions 70. In another embodiment, the dummy dielectric layer 72 covers only the semiconductor fins 62 and/or the nanostructures 64, 66.

FIGS. 7A-20B illustrate various additional steps in the manufacturing of embodiment devices. FIGS. 7A-20B illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P will be explained in the description of each figure.

Figure 7B:
Figure 7B:
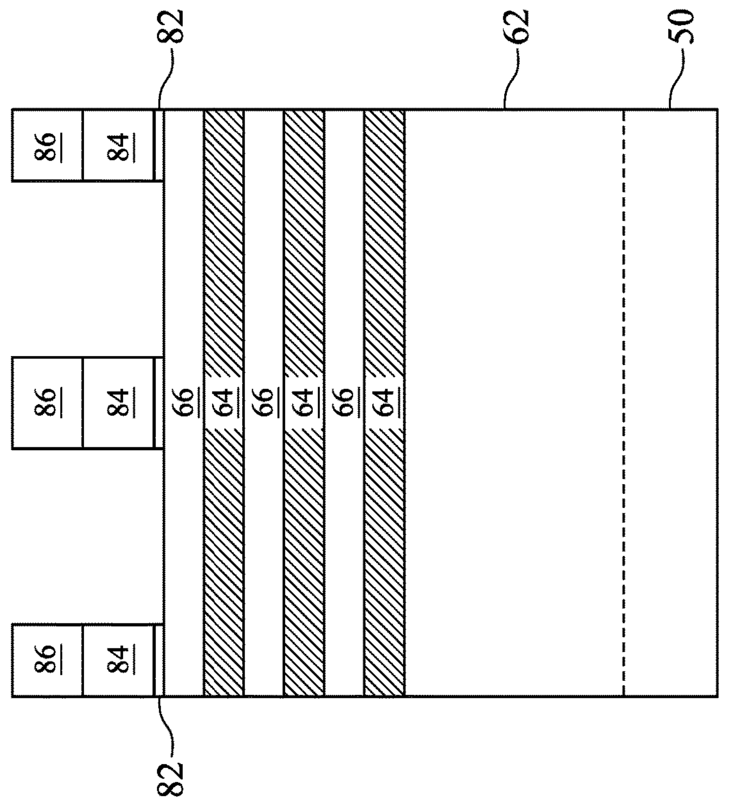
Figure 7A:
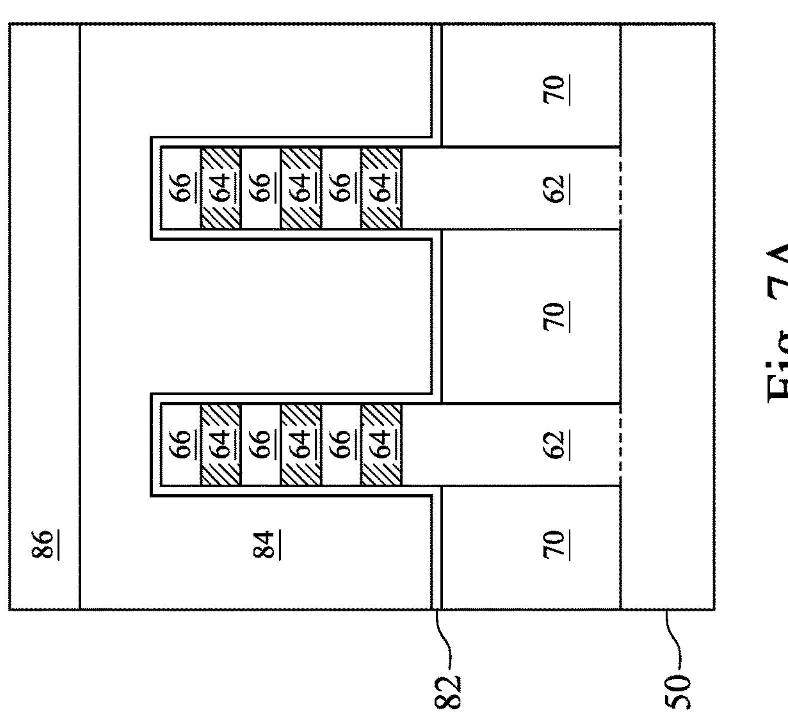

In FIGS. 7A-7B, the mask layer 76 is patterned using acceptable photolithography and etching techniques to form masks 86. The pattern of the masks 86 then may be transferred to the dummy gate layer 74 and to the dummy dielectric layer 72 to form dummy gates 84 and dummy dielectrics 82, respectively. The dummy gates 84 cover respective channel regions of the nanostructures 64, 66. The pattern of the masks 86 may be used to physically separate each of the dummy gates 84 from adjacent dummy gates 84. The dummy gates 84 may also have a lengthwise direction substantially perpendicular to the lengthwise direction of respective semiconductor fins 62. The masks 86 can optionally be removed after patterning, such as by any acceptable etching technique.

Figure 8A:
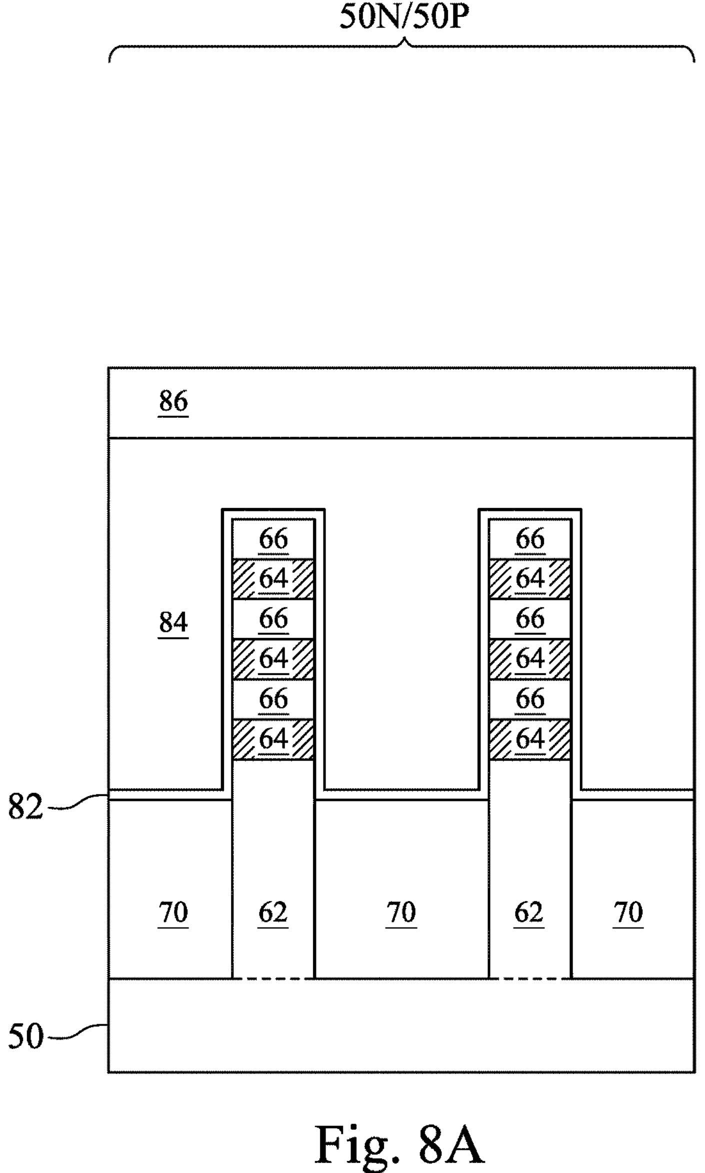
Figure 8B:
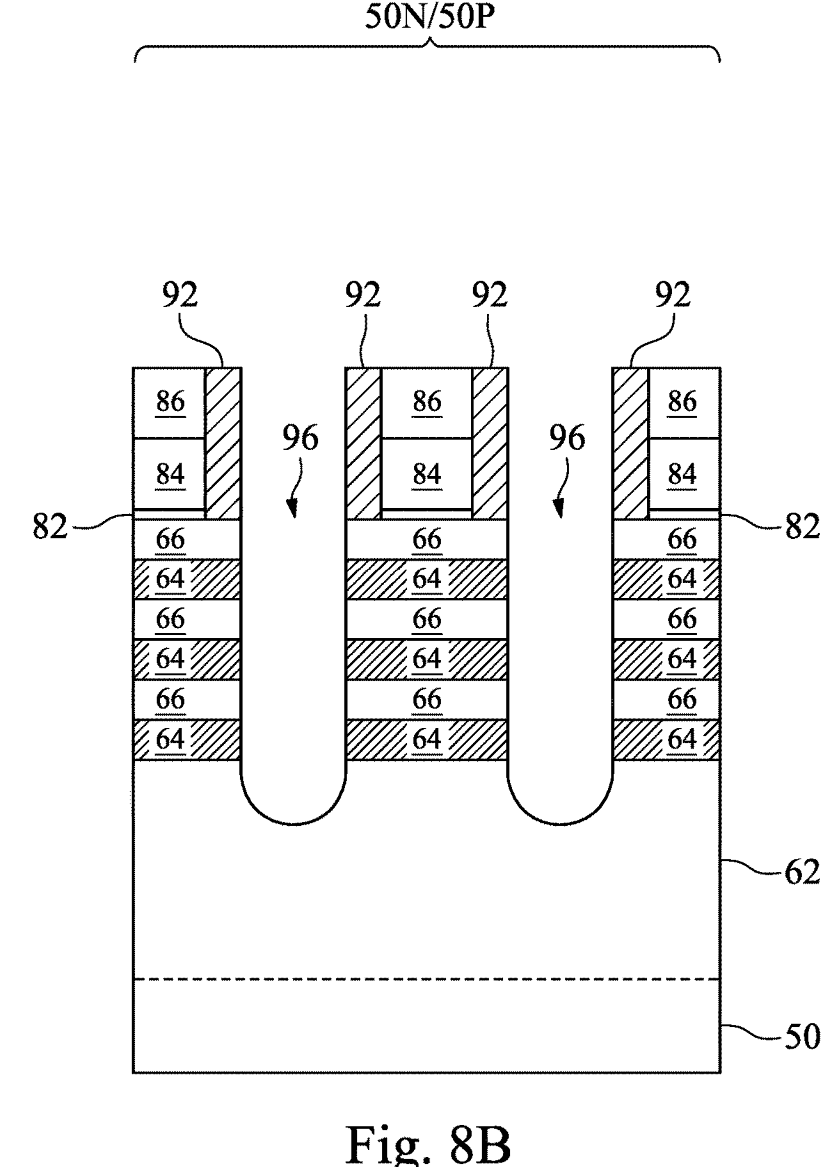

In FIGS. 8A-8B, gate spacers 92 are formed over the nanostructures 64, 66 and the isolation regions 70, on exposed sidewalls of the masks 86 (if present), the dummy gates 84, and the dummy dielectrics 82. The gate spacers 92 may be formed by conformally forming one or more dielectric material(s) and subsequently etching the dielectric material(s). Acceptable dielectric materials may include silicon oxide, silicon nitride, silicon oxynitride, silicon oxycarbonitride, or the like, which may be formed by a deposition process such as chemical vapor deposition (CVD), atomic layer deposition (ALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 84 (thus forming the gate spacers 92). As subsequently described in greater detail, the dielectric material(s), when etched, may also have portions left on the sidewalls of the semiconductor fins 62 and/or the nanostructures 64, 66 (thus forming fin spacers 94, see FIGS. 10C-10D). After etching, the fin spacers 94 and/or the gate spacers 92 can have straight sidewalls (as illustrated) or can have curved sidewalls (not separately illustrated).

Further, implants for lightly doped source/drain (LDD) regions (not separately illustrated) may be performed. The LDD implants may be performed before the gate spacers 92 are formed. In embodiments with different device types, similar to the implants for the previously described wells, a mask, such as a photoresist, may be formed over the n-type region 50N, while exposing the p-type region 50P, and appropriate type (e.g., p-type) impurities may be implanted into the semiconductor fins 62 and the nanostructures 64, 66 exposed in the p-type region 50P. The mask may then be removed. Subsequently, a mask, such as a photoresist, may be formed over the p-type region 50P while exposing the n-type region 50N, and appropriate type impurities (e.g., n-type) may be implanted into the semiconductor fins 62 and the nanostructures 64, 66 exposed in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from $10^{15}$ atoms/cm$^3$ to $10^{19}$ atoms/cm$^3$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Source/drain recesses 96 are patterned in the semiconductor fins 62, the nanostructures 64, 66, and the substrate 50. Epitaxial source/drain regions will be subsequently formed in the source/drain recesses 96. The source/drain recesses 96 may extend through the nanostructures 64, 66 and into the substrate 50. In some embodiments, the semiconductor fins 62 may be etched such that bottom surfaces of the source/drain recesses 96 are disposed below the top surfaces of the isolation regions 70. The source/drain recesses 96 may be formed by etching the semiconductor fins 62, the nanostructures 64, 66, and the substrate 50 using anisotropic etching processes, such as RIE, NBE, or the like. The gate spacers 92 and the dummy gates 84 mask portions of the semiconductor fins 62, the nanostructures 64, 66, and the substrate 50 during the etching processes used to form the source/drain recesses 96. A single etch process or multiple etch processes may be used to etch each layer of the nanostructures 64, 66 and/or the semiconductor fins 62. Timed etch processes may be used to stop the etching of the source/drain recesses 96 after the source/drain recesses 96 reach a desired depth.

Figure 9A:
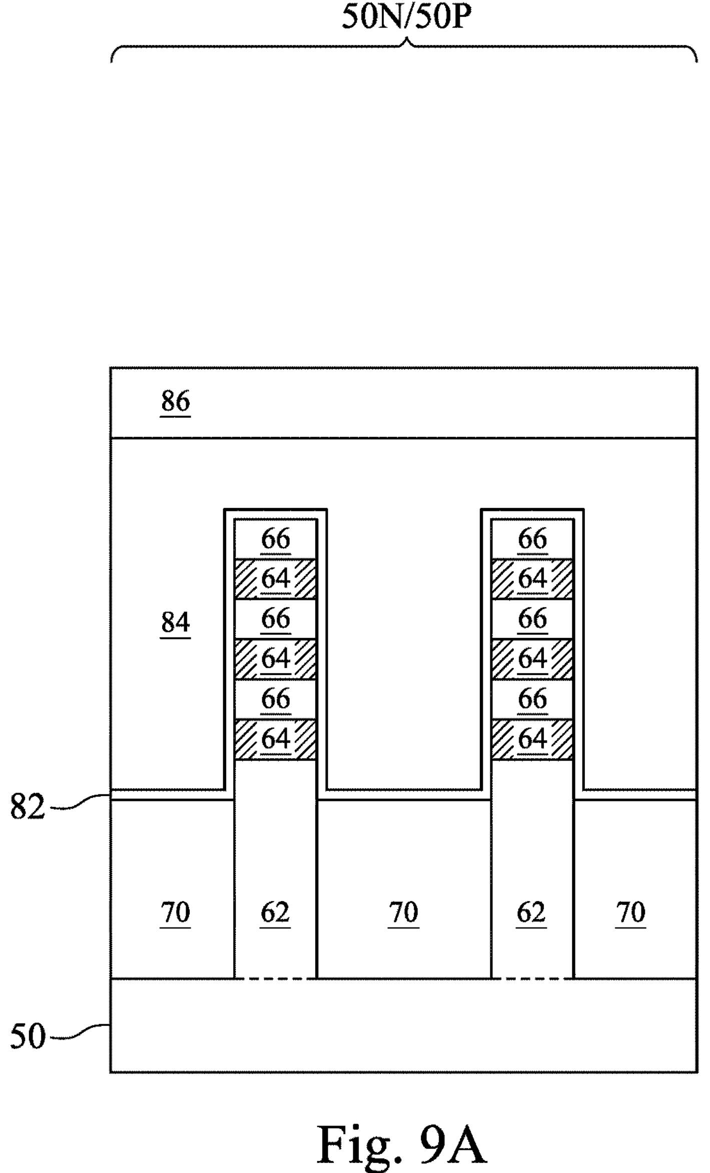
Figure 9B:
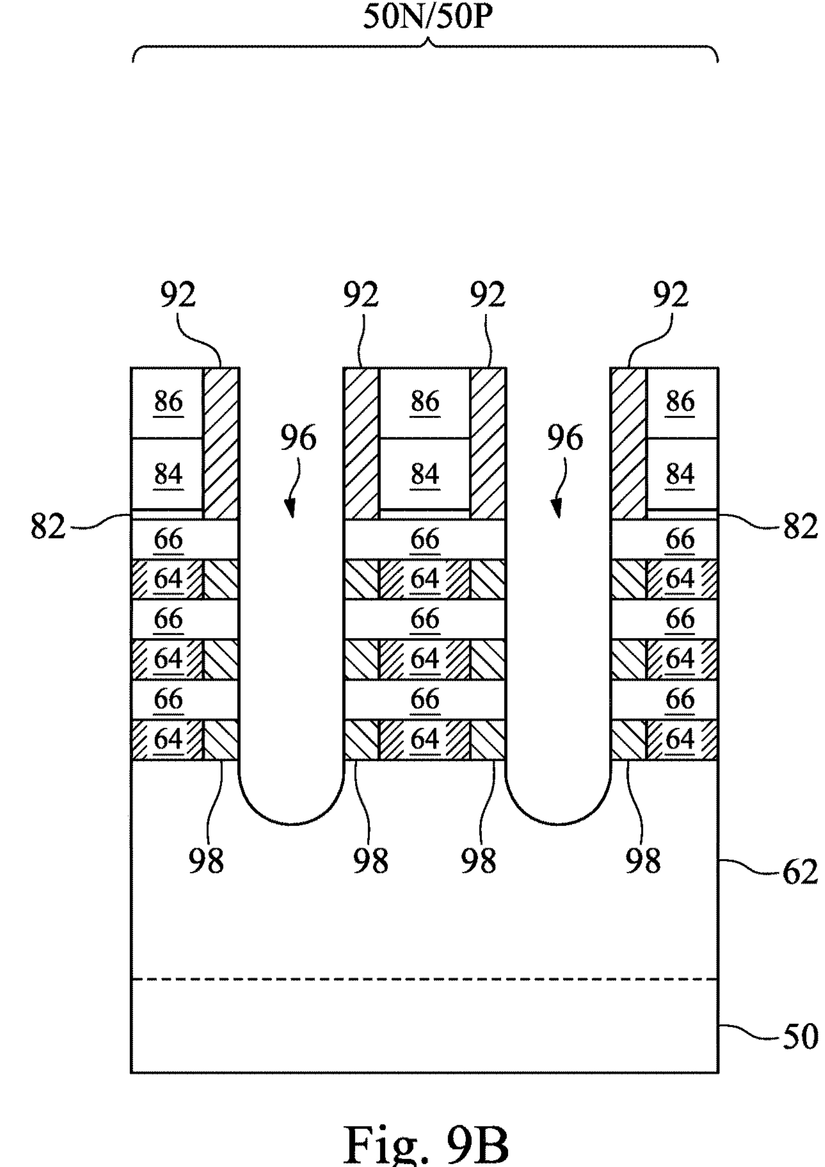

In FIGS. 9A-9B, inner spacers 98 are formed on the sidewalls of the remaining portions of the dummy nanostructures 64, e.g., those sidewalls exposed by the source/drain recesses 96. As subsequently described in greater detail, source/drain regions will be formed in the source/drain recesses 96, and the dummy nanostructures 64 will be replaced with corresponding gate structures. The inner spacers 98 act as isolation features between the subsequently formed source/drain regions and the subsequently formed gate structures. Further, the inner spacers 98 may be used to prevent damage to the subsequently formed source/drain regions by subsequent etch processes, such as etch processes used to subsequently remove the dummy nanostructures 64.

As an example to form the inner spacers 98, the source/drain recesses 96 can be laterally expanded. Specifically, portions of the sidewalls of the dummy nanostructures 64 exposed by the source/drain recesses 96 may be recessed to form sidewall recesses. Although sidewalls of the dummy nanostructures 64 are illustrated as being straight, the sidewalls may be concave or convex. The sidewalls may be recessed by any acceptable etch process, such as one that is selective to the material of the dummy nanostructures 64 (e.g., selectively etches the material of the dummy nanostructures 64 at a faster rate than the semiconductor material (s) of the semiconductor nanostructures 66). The etching may be isotropic. For example, when the semiconductor nanostructures 66 are formed of silicon and the dummy nanostructures 64 are formed of silicon-germanium, the etch process may be a wet etch using tetramethylammonium hydroxide (TMAH), ammonium hydroxide ($NH_4OH$), or the like. In some embodiments, the same etch process may be continually performed to both form the source/drain recesses 96 and recess the sidewalls of the dummy nanostructures 64. An insulating material may then be conformally formed in the source/drain recesses 96 (including the sidewall recesses) and subsequently etched. The insulating material may be silicon nitride or silicon oxynitride, although any suitable material, such as low-dielectric constant (low-k) materials having a k-value less than about 3.5, may be utilized. The insulating material may be formed by a deposition process, such as ALD, CVD, or the like. The etching of the insulating material may be anisotropic. For example, the etch process may be a dry etch such as a RIE, a NBE, or the like. The insulating material, when etched, has portions remaining in the sidewall recesses (thus forming the inner spacers 98). Although outer sidewalls of inner spacers 98 are illustrated as being flush with sidewalls of the semiconductor nanostructures 66, the outer sidewalls of the inner spacers 98 may extend beyond or be recessed from the sidewalls of the semiconductor nanostructures 66. In other words, the inner spacers 98 may partially fill, completely fill, or overfill the sidewall recesses. Moreover, although the sidewalls of the inner spacers 98 are illustrated as being straight, the sidewalls of the inner spacers 98 may be concave or convex.

Figure 10A:
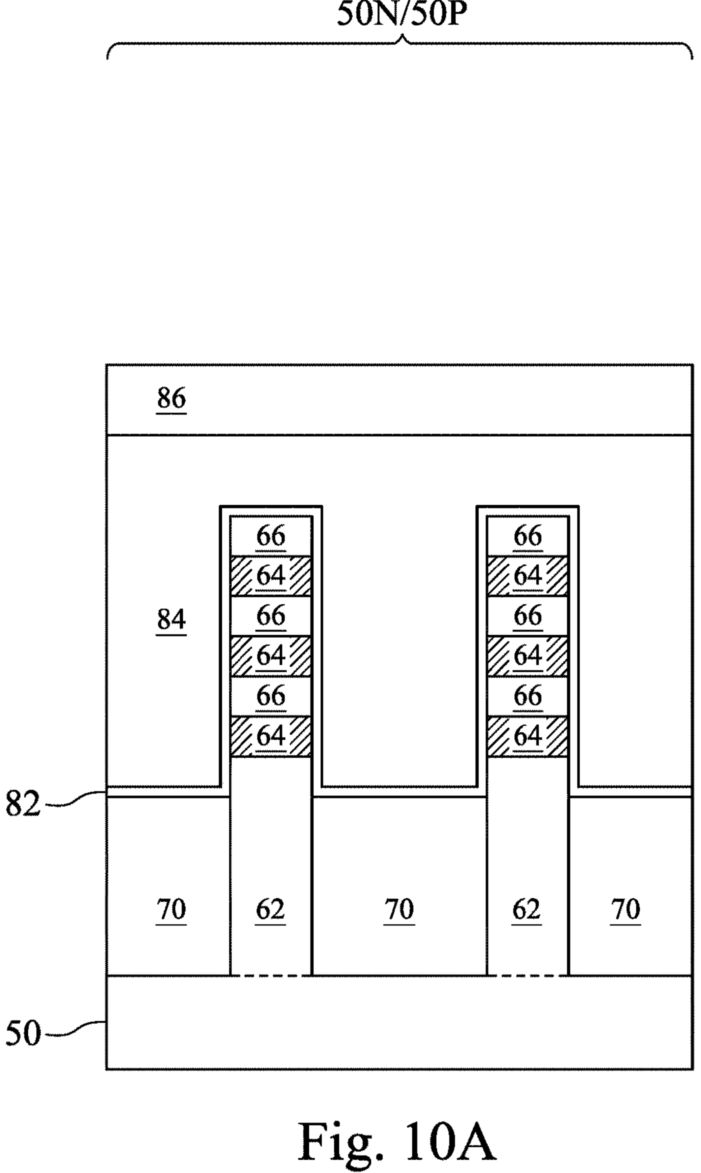
Figure 10B:
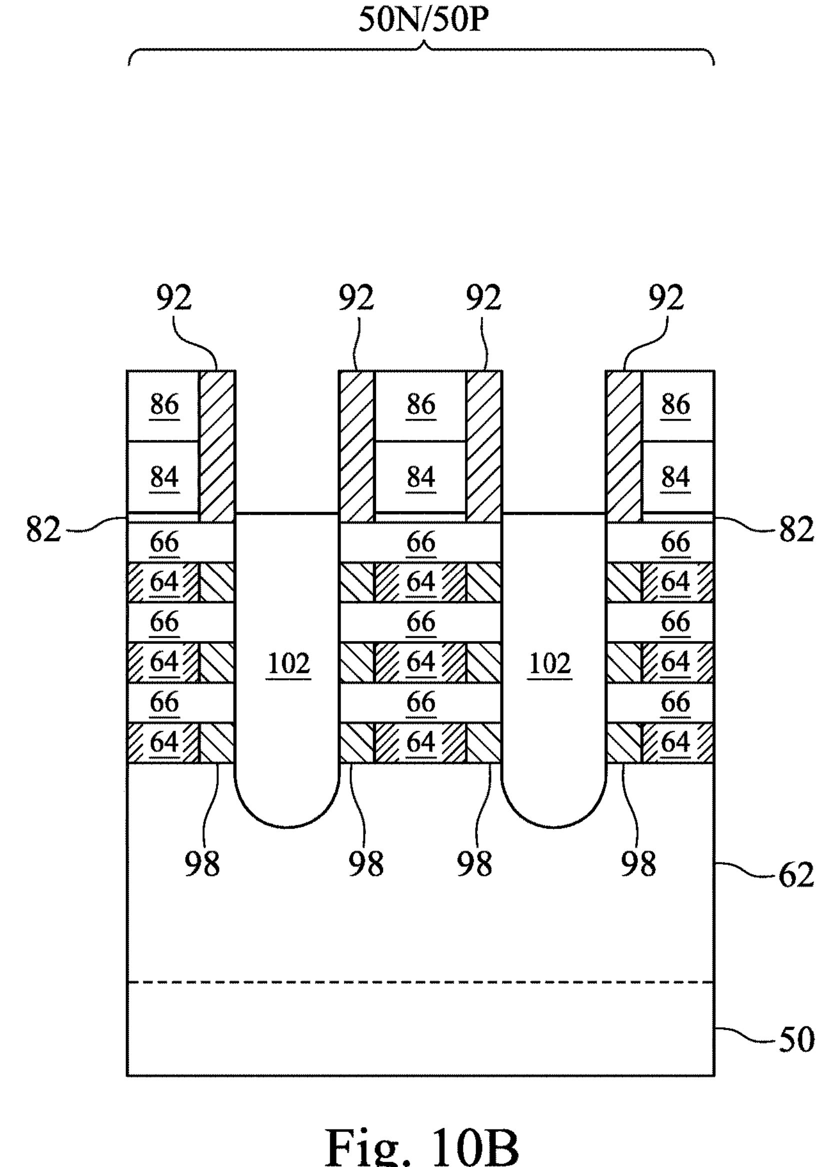
Figure 10D:
Figure 10D:
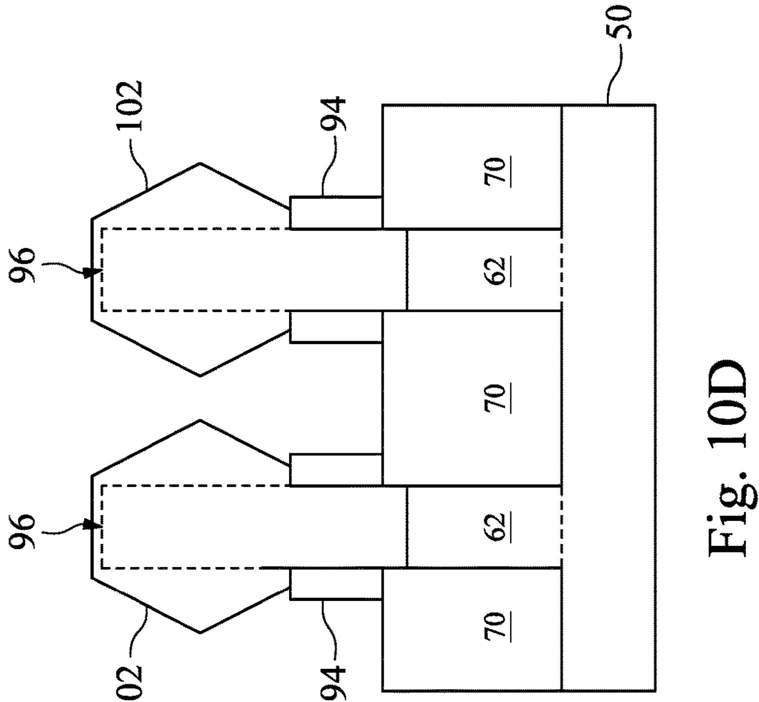
Figure 10C:
Figure 10C:
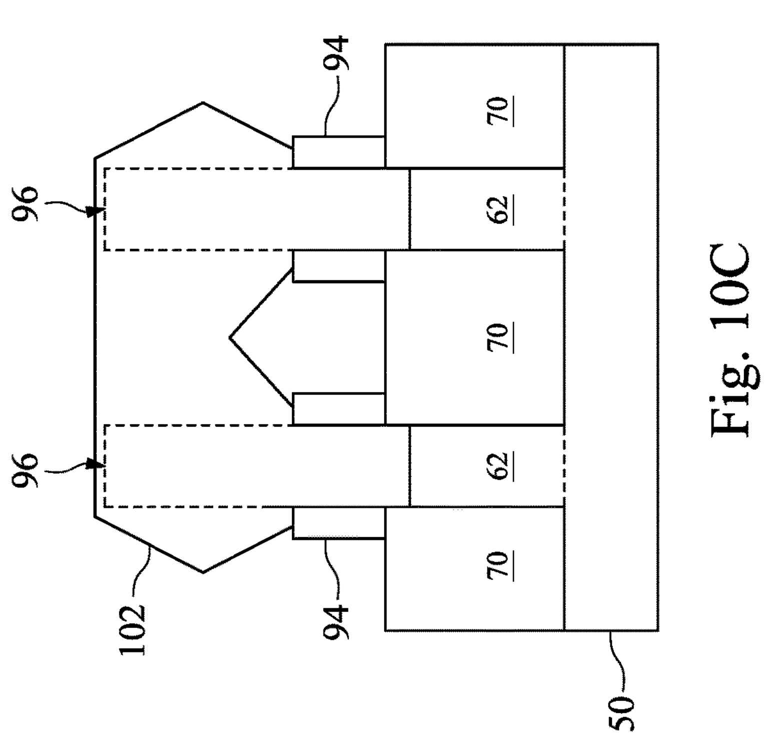

In FIGS. 10A-10B, epitaxial source/drain regions 102 are formed in the source/drain recesses 96. In some embodiments, the epitaxial source/drain regions 102 exert stress in the respective channel regions of the semiconductor nanostructures 66, thereby improving performance. The epitaxial source/drain regions 102 are formed in the source/drain recesses 96 such that each dummy gate 84 is disposed between respective neighboring pairs of the epitaxial source/drain regions 102. In some embodiments, the gate spacers 92 are used to separate the epitaxial source/drain regions 102 from the dummy gates 84 and the inner spacers 98 are used to separate the epitaxial source/drain regions 102 from the dummy nanostructures 64 by an appropriate lateral distance so that the epitaxial source/drain regions 102 do not short out with subsequently formed gates of the resulting nanostructure-FETs.

The epitaxial source/drain regions 102 in the n-type region 50N may be formed by masking the p-type region 50P. Then, the epitaxial source/drain regions 102 are epitaxially grown in the source/drain recesses 96 in the n-type region 50N. The epitaxial source/drain regions 102 in the n-type region 50N may include any acceptable material appropriate for n-type nanostructure-FETs. For example, if the semiconductor nanostructures 66 are formed of silicon, the epitaxial source/drain regions 102 in the n-type region 50N may include materials exerting a tensile strain on the semiconductor nanostructures 66, such as silicon, silicon carbide, phosphorous doped silicon carbide, silicon phosphide, or the like. The epitaxial source/drain regions 102 in the n-type region 50N may be referred to as "n-type source/drain regions." The epitaxial source/drain regions 102 may have surfaces raised from respective upper surfaces of the nanostructures 64, 66 and may have facets.

The epitaxial source/drain regions 102 in the p-type region 50P may be formed by masking the n-type region 50N. Then, the epitaxial source/drain regions 102 are epitaxially grown in the source/drain recesses 96 in the p-type region 50P. The epitaxial source/drain regions 102 in the p-type region 50P may include any acceptable material appropriate for p-type nanostructure-FETs. For example, if the semiconductor nanostructures 66 are formed of silicon, the epitaxial source/drain regions 102 in the p-type region 50P may include materials exerting a compressive strain on the dummy nanostructures 64, such as silicon-germanium, boron doped silicon-germanium, germanium, germanium tin, or the like. The epitaxial source/drain regions 102 in the p-type region 50P may be referred to as "p-type source/drain regions." The epitaxial source/drain regions 102 may also have surfaces raised from respective surfaces of the nanostructures 64, 66 and may have facets.

The epitaxial source/drain regions 102, the nanostructures 64, 66, and/or the semiconductor fins 62 may be implanted with dopants to form source/drain regions, similar to the process previously discussed for forming lightly-doped source/drain regions, followed by an anneal. The source/drain regions may have an impurity concentration of between $10^{19}$ atoms/cm$^3$ to $10^{21}$ atoms/cm$^3$. The n-type and/or p-type impurities for source/drain regions may be any of the impurities previously discussed. In some embodiments, the epitaxial source/drain regions 102 may be in situ doped during growth.

As a result of the epitaxy processes used to form the epitaxial source/drain regions 102, upper surfaces of the epitaxial source/drain regions 102 have facets which expand laterally outward beyond sidewalls of the nanostructures 64, 66. In some embodiments, these facets cause adjacent epitaxial source/drain regions 102 of a same nanostructure-FET to merge as illustrated by FIG. 1C. In other embodiments, adjacent epitaxial source/drain regions 102 remain separated after the epitaxy process is completed as illustrated by FIG. 10D. In the illustrated embodiments, the fin spacers 94 are formed on a top surface of the isolation regions 70, thereby blocking the epitaxial growth. In some other embodiments, the fin spacers 94 may cover portions of the sidewalls of the nanostructures 64, 66 and/or the semiconductor fins 62, further blocking the epitaxial growth. In another embodiment, the spacer etch used to form the gate spacers 92 is adjusted to not form the fin spacers 94, so as to allow the epitaxial source/drain regions 102 to extend to the surface of the isolation regions 70.

The epitaxial source/drain regions 102 may include one or more semiconductor layers. For example, the epitaxial source/drain regions 102 may include a first semiconductor layer, a second semiconductor layer, and a third semiconductor layer. Any number of semiconductor layers may be used for the epitaxial source/drain regions 102. Each of the first semiconductor layer, the second semiconductor layer, and the third semiconductor layer may be formed of different semiconductor materials and may be doped to different dopant concentrations. In some embodiments, the first semiconductor layer may have a dopant concentration less than the second semiconductor layer and greater than the third semiconductor layer. In embodiments in which the epitaxial source/drain regions 102 include three semiconductor layers, the first semiconductor layer may be grown on the sidewalls of the semiconductor nanostructures 66, the second semiconductor layer may be grown on the first semiconductor layer, and the third semiconductor layer may be grown on the second semiconductor layer.

Figure 11B:
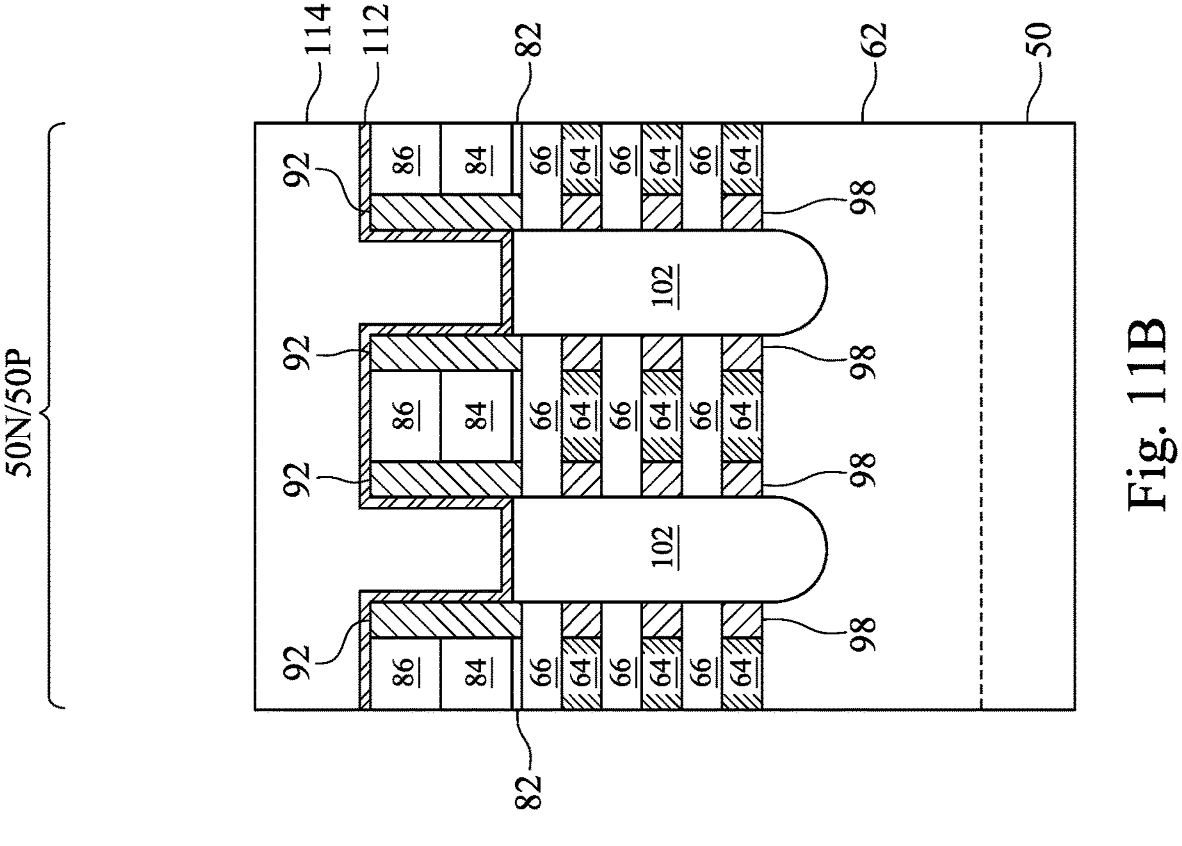
Figure 11A:
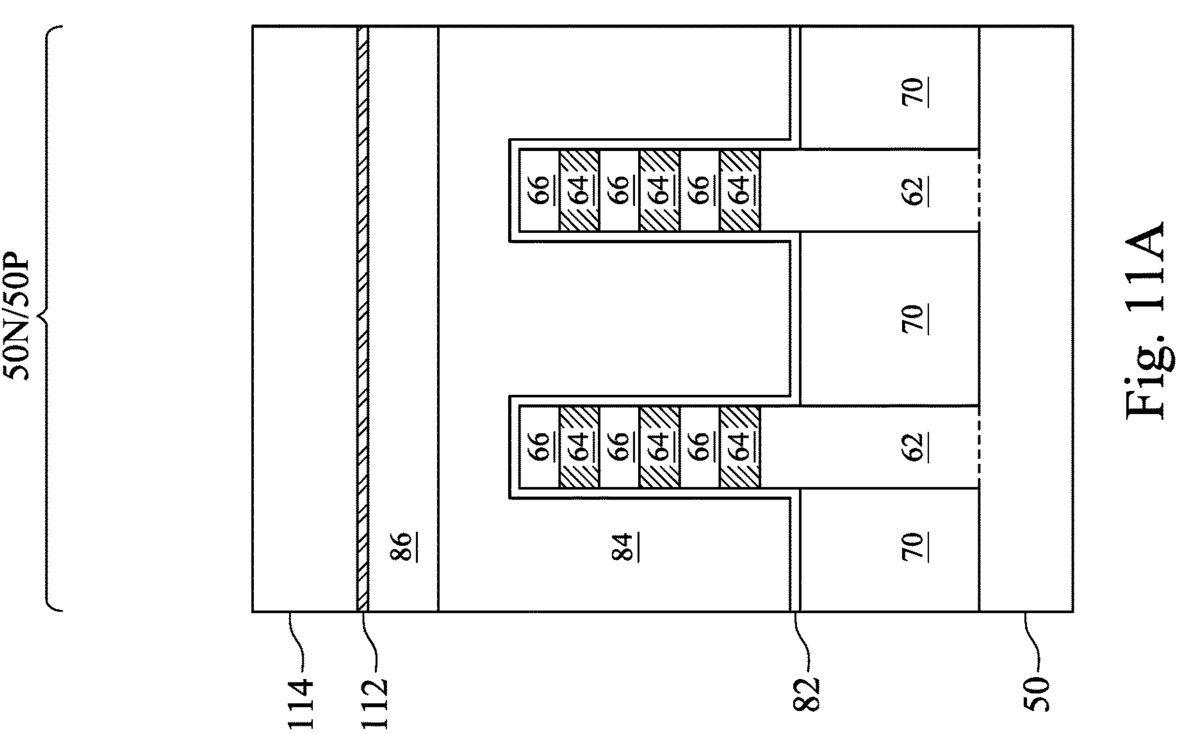

In FIGS. 11A-11B, a first ILD 114 is deposited over the epitaxial source/drain regions 102, the gate spacers 92, and the masks 86 (if present) or the dummy gates 84. The first ILD 114 may be formed of a dielectric material, which may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 112 is formed between the first ILD 114 and the epitaxial source/drain regions 102, the gate spacers 92, and the masks 86 (if present) or the dummy gates 84. The CESL 112 may be formed of a dielectric material having a high etching selectivity from the etching of the first ILD 114, such as silicon nitride, silicon oxynitride, or the like, which may be formed by any suitable deposition process, such as CVD, ALD, or the like.

Figures 12A, 12B:
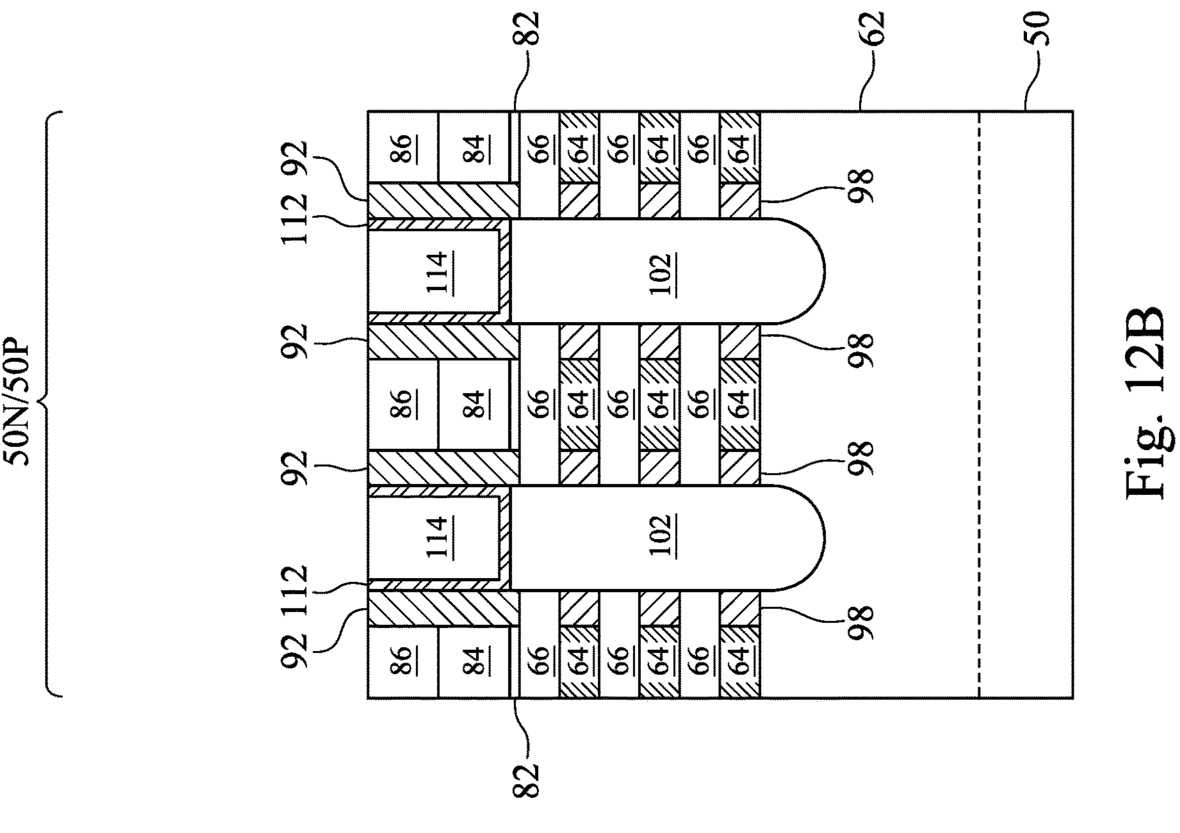

In FIGS. 12A-12B, a removal process is performed to level the top surfaces of the first ILD 114 with the top surfaces of the gate spacers 92 and the masks 86 (if present) or the dummy gates 84. In some embodiments, a planarization process such as a chemical mechanical polish (CMP), an etch-back process, combinations thereof, or the like may be utilized. The planarization process may also remove the masks 86 on the dummy gates 84, and portions of the gate spacers 92 along sidewalls of the masks 86. After the planarization process, top surfaces of the first ILD 114, the gate spacers 92, and the masks 86 (if present) or the dummy gates 84 are substantially coplanar (within process variations). Accordingly, the top surfaces of the masks 86 (if present) or the dummy gates 84 are exposed through the first ILD 114.

Figures 13A, 13B:
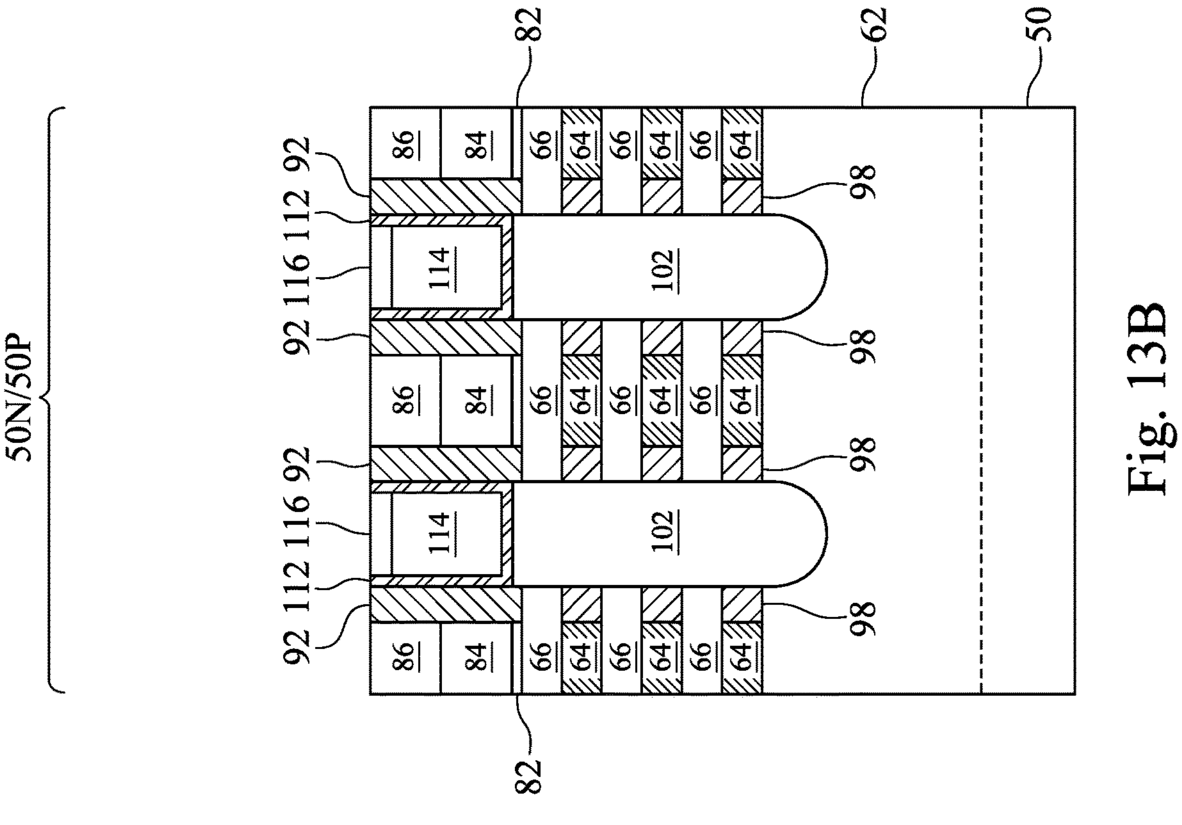

In FIGS. 13A-13B, ILD masks 116 are formed over the remaining portions of the first ILD 114. The ILD masks 116 cover the first ILD 114 to protect it during a subsequent gate replacement process. As an example to form the ILD masks 116, the first ILD 114 may be recessed, so that recesses are formed between opposing ones of the gate spacers 92. The recessing may be any acceptable etch process, such as a wet or dry etch. An insulating material can then be conformally formed in the recesses. The insulating material may be silicon nitride or silicon oxynitride, although any suitable material, such as low-dielectric constant (low-k) materials having a k-value less than about 3.5, may be utilized. The insulating material may be formed by a deposition process, such as ALD, CVD, or the like. The excess portions of the insulating material, which excess portions are over the top surfaces of the gate spacers 92 and the masks 86 (if present) or the dummy gates 84, are then removed. In some embodiments, a planarization process such as a chemical mechanical polish (CMP), an etch-back process, combinations thereof, or the like may be utilized. The insulating material, after the removal process, has portions left in the recesses (thus forming the ILD masks 116).

Figure 14B:
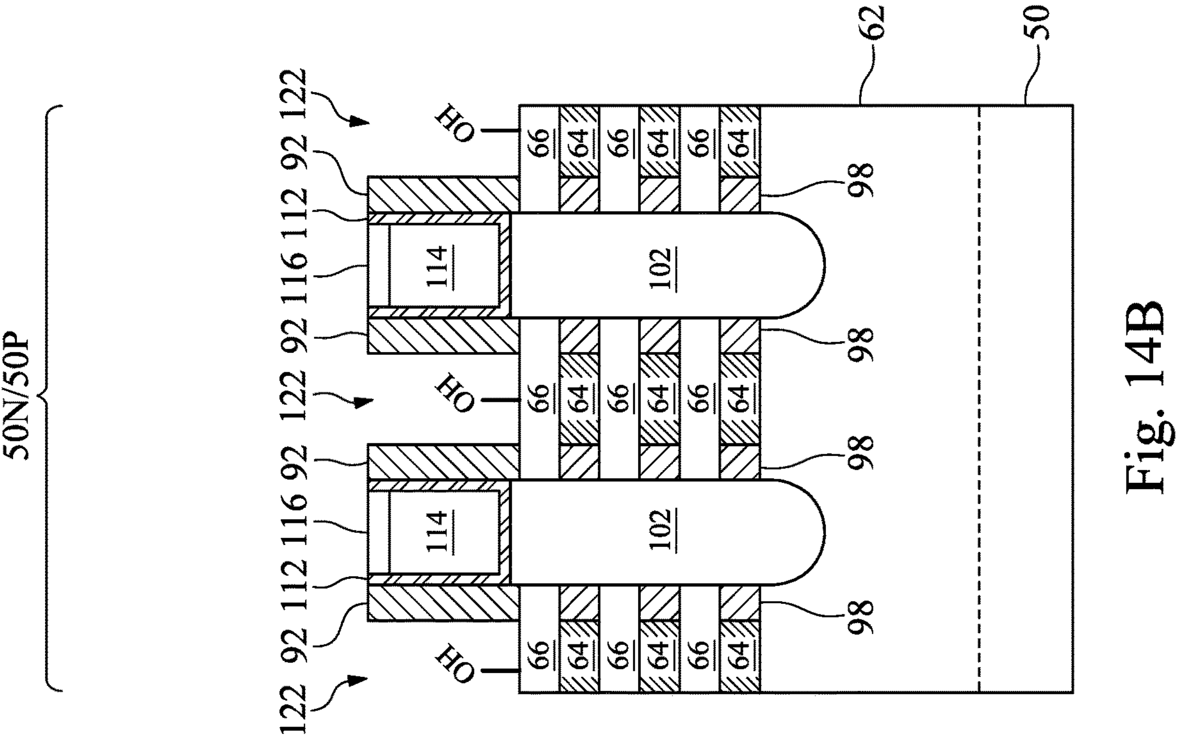
Figure 14A:
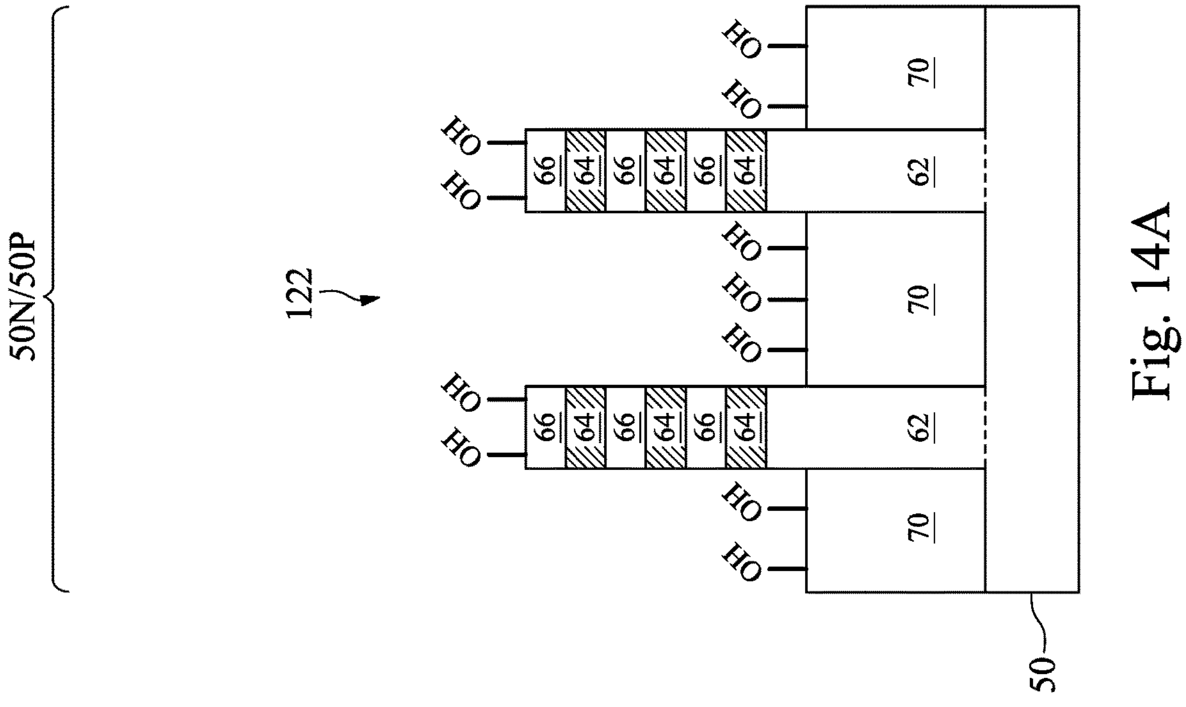

In FIGS. 14A-14B, the masks 86 (if present) and the dummy gates 84 are removed in one or more etching steps, so that recesses 122 are formed between the gate spacers 92. Portions of the dummy dielectrics 82 in the recesses 122 are also removed. In some embodiments, the dummy gates 84 and the dummy dielectrics 82 are removed by an anisotropic dry etch process. For example, the etching process may include a dry etch process using reaction gas(es) that selectively etch the material of the dummy gates 84 at a faster rate than the materials of the gate spacers 92 and the ILD masks 116 (if present) or the first ILD 114. Each recess 122 exposes and/or overlies the portions of the semiconductor nanostructures 66 which act as the channel regions in subsequently completed nanostructure-FETs. The portions of the semiconductor nanostructures 66 which act as the channel regions are disposed between neighboring pairs of the epitaxial source/drain regions 102. During the removal, the dummy dielectrics 82 may be used as etch stop layers when the dummy gates 84 are etched. The dummy dielectrics 82 may then be removed after the removal of the dummy gates 84.

Further, dangling hydroxyl groups (OH) are formed on the top surfaces of the upper semiconductor nanostructures 66 and on the top surfaces of the isolation regions 70. The hydroxyl groups may be bonded to silicon atoms of the semiconductor nanostructures 66 and the isolation regions 70. The hydroxyl groups may be formed due to native oxidation and/or exposure to moisture during the formation of the recesses 122, or may be formed by a surface hydroxylation process after the formation of the recesses 122. The surface hydroxylation process may be a plasma treatment performed with precursors that leave behind hydroxyl groups on the treated surfaces, such as a combination of oxygen ($O_2$) and hydrogen ($H_2$). The surface hydroxylation process may be anisotropic, such that the top surfaces of the upper semiconductor nanostructures 66 and the isolation regions 70 are hydroxylated. Accordingly, the sidewalls of the gate spacers 92, the nanostructures 64, 66, and the semiconductor fins 62 may not be hydroxylated. The ILD masks 116 may protect the first ILD 114 from hydroxylation.

Figure 15B:
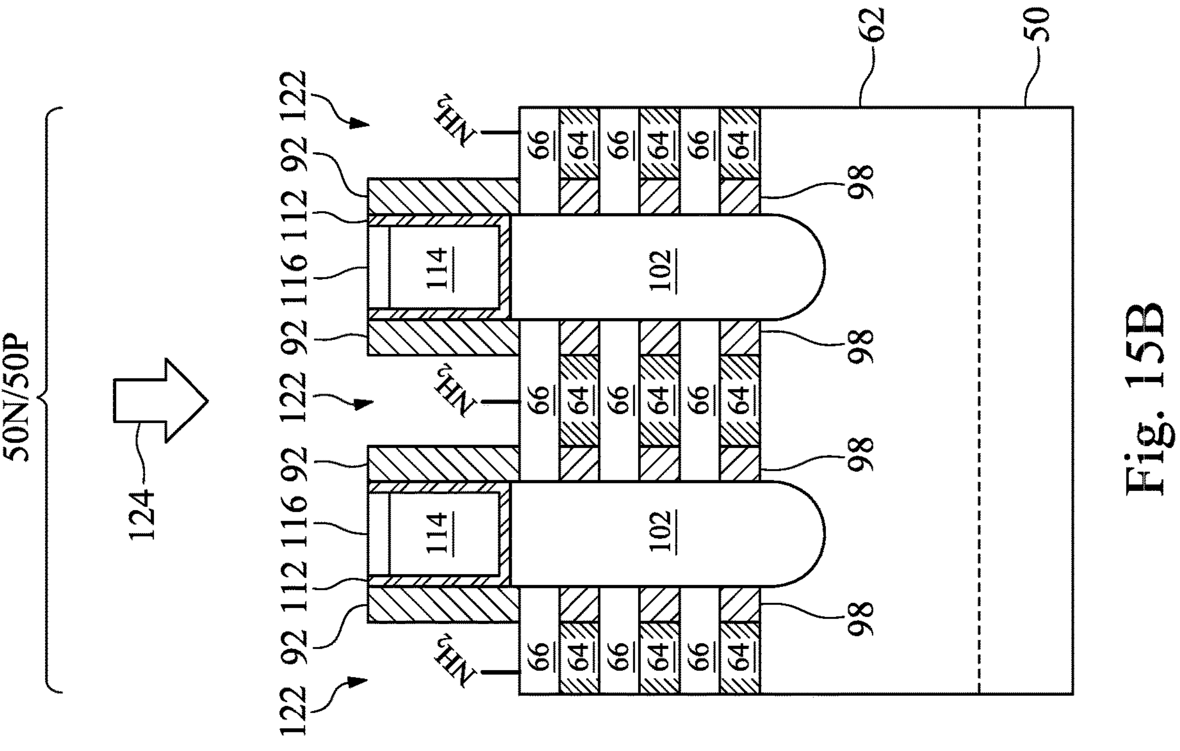
Figure 15A:
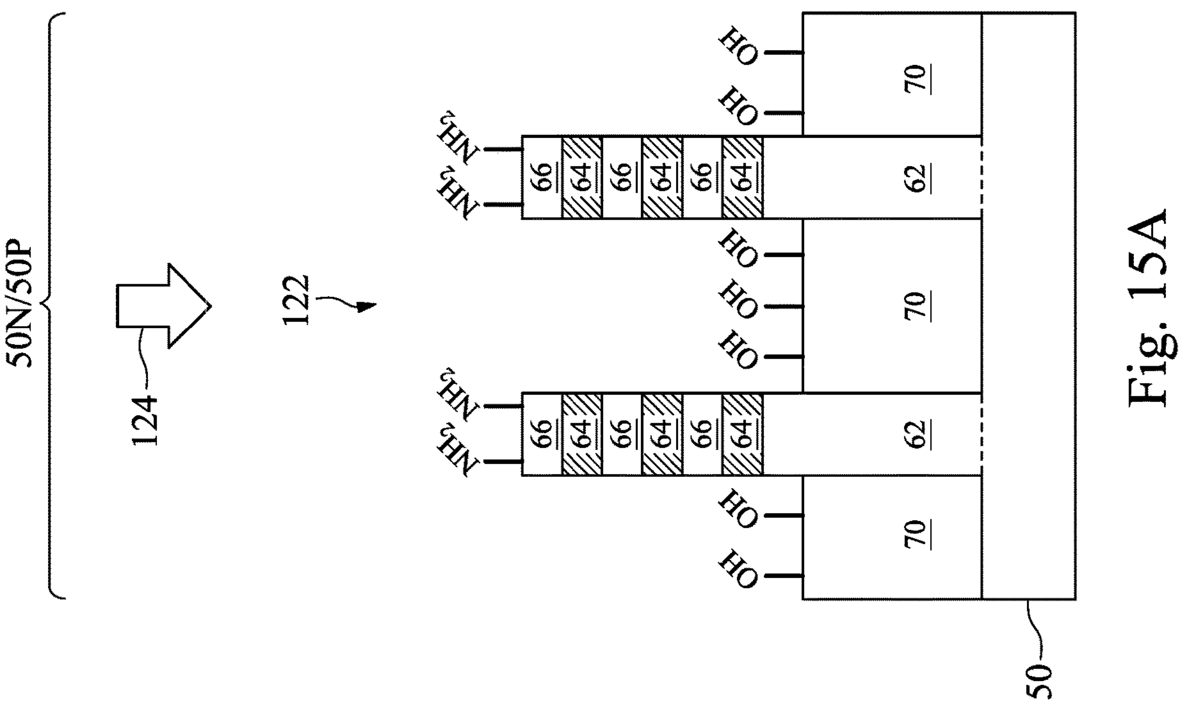

In FIGS. 15A-15B, a treatment process 124 is performed to selectively replace some of the dangling hydroxyl groups with dangling amino groups ($NH_2$). Specifically, at least some of the hydroxyl groups dangling from the top surfaces of the upper semiconductor nanostructures 66 are replaced with dangling amino groups. As subsequently described in greater detail, protection layers will be formed on the isolation regions 70 by selectively depositing a protection material on desired surfaces. The precursors for the protection material react with hydroxyl groups but do not react with amino groups, such that the deposition of the protection material is effectively inhibited on surfaces where dangling hydroxyl groups are replaced with dangling amino groups. Accordingly, replacing at least some of the dangling hydroxyl groups with dangling amino groups (e.g., at the top surfaces of the upper semiconductor nanostructures 66) effectively increases the deposition selectivity between the top surfaces of the upper semiconductor nanostructures 66 and the top surfaces of the isolation regions 70, relative the selective deposition process that will be used to form the protection layers. Thus, the locations of the subsequently deposited protection layers may advantageously be controlled by replacing desired hydroxyl groups with amino groups.

The treatment process 124 breaks hydroxyl groups off from silicon atoms of the semiconductor nanostructures 66 and attaches the amino groups to those silicon atoms, thereby replacing the hydroxyl groups with amino groups. The treatment process 124 has a first replacement ratio on the top surfaces of the upper semiconductor nanostructures 66, while the treatment process 124 has a second replacement ratio on the top surfaces of the isolation regions 70. In this context, the "replacement ratio" refers to the percentage of hydroxyl groups that are replaced with amino groups by the treatment process 124. It is more difficult for the treatment process 124 to reach the lower portions of the recesses 122 than to reach the upper portions of the recesses 122. Accordingly, the first replacement ratio of the top surfaces of the upper semiconductor nanostructures 66 is greater than the second replacement ratio of the top surfaces of the isolation regions 70. The treatment process 124 is controlled so that the difference between the replacement ratios of the semiconductor nanostructures 66 and the isolation regions 70 is large.

After the treatment process 124, the top surfaces of the upper semiconductor nanostructures 66 have fewer dangling hydroxyl groups and more dangling amino groups than the top surfaces of the isolation regions 70. In this embodiment, the hydroxyl groups dangling from the top surfaces of the upper semiconductor nanostructures 66 are fully replaced with amino groups, while no hydroxyl groups dangling from the top surfaces of the isolation regions 70 are replaced with amino groups. Thus, the top surfaces of the isolation regions 70 may be substantially free from amino groups after the treatment process 124. In another embodiment (subsequently described for FIGS. 21A-21B), the hydroxyl groups dangling from the top surfaces of the upper semiconductor nanostructures 66 and the isolation regions 70 are replaced with amino groups, but more of the hydroxyl groups dangling from the top surfaces of the upper semiconductor nanostructures 66 are replaced with amino groups than are the hydroxyl groups dangling from the top surfaces of the isolation regions 70. Thus, amino groups may still dangle from the top surfaces of the isolation regions 70 after the treatment process 124.

In some embodiments, the treatment process 124 is a nitrogen soak process, in which the semiconductor nanostructures 66 are soaked in a nitrogen-containing gas without generating a plasma. The nitrogen soak process may be performed in a chamber, into which the nitrogen-containing gas is dispensed. The nitrogen-containing gas may include a nitrogen precursor and a carrier gas. The nitrogen precursor may be ammonia ($NH_3$), nitrogen gas ($N_2$), a combination thereof, or the like. The carrier gas may be an inert gas such as Ar, He, Xe, Ne, Kr, Rn, the like, or combinations thereof. The nitrogen soak is performed at a high temperature, such as by heating the chamber during the nitrogen soak process. In some embodiments, the nitrogen soak is performed at a temperature in the range of 400° C. to 800° C. and for a duration in the range of 4 hours to 8 hours. As a result, the hydroxyl groups break off from silicon atoms of the semiconductor nanostructures 66, the hydroxyl groups react with the nitrogen precursor to form amino groups, and the amino groups attach to those silicon atoms. Performing the nitrogen soak with the nitrogen-containing gas and at a high temperature may help achieve the aforementioned large difference between the replacement ratios of the semiconductor nanostructures 66 and the isolation regions 70.

In some embodiments, the treatment process 124 is a nitrogen plasma treatment, in which the semiconductor nanostructures 66 are bombarded with nitrogen-containing ions. The nitrogen-containing ions may be nitrenium ions ($NH_2^+$), nitrogen ions ($N_2^+$), a combination thereof, or the like. The nitrogen plasma treatment may be performed in a chamber, into which a source gas is dispensed. The source gas may include a nitrogen precursor and a carrier gas. The nitrogen precursor may be ammonia ($NH_3$), nitrogen gas ($N_2$), a combination thereof, or the like. The carrier gas may be an inert gas such as Ar, He, Xe, Ne, Kr, Rn, the like, or combinations thereof. A plasma is generated in the chamber from the source gas. The plasma may be generated by a plasma generator such as an inductively coupled plasma system, a capacitively coupled plasma system, a microwave plasma generator, or the like. The plasma generator generates radio frequency power that produces a plasma from the source gas by exciting the source gas to a plasma state. The plasma generation power may be pulsed between a low power (e.g., substantially zero watts) and a high power. In some embodiments, the nitrogen plasma treatment is performed using a plasma generation power having a high power in the range of 200 watts to 800 watts. In some embodiments, the nitrogen plasma treatment is performed at a temperature in the range of 200° C. to 450° C. and for a duration in the range of 30 minutes to 2 hours. The generated plasma includes nitrogen-containing ions, and the semiconductor nanostructures 66 are bombarded with the nitrogen-containing ions. As a result, the hydroxyl groups break off from silicon atoms of the semiconductor nanostructures 66, the hydroxyl groups react with the nitrogen-containing ions to form amino groups, and the amino groups attach to those silicon atoms. Performing the nitrogen plasma treatment with a nitrogen precursor and with a desired plasma generation power or temperature may help achieve the aforementioned large difference between the replacement ratios of the semiconductor nanostructures 66 and the isolation regions 70.

Figures 16A, 16B:
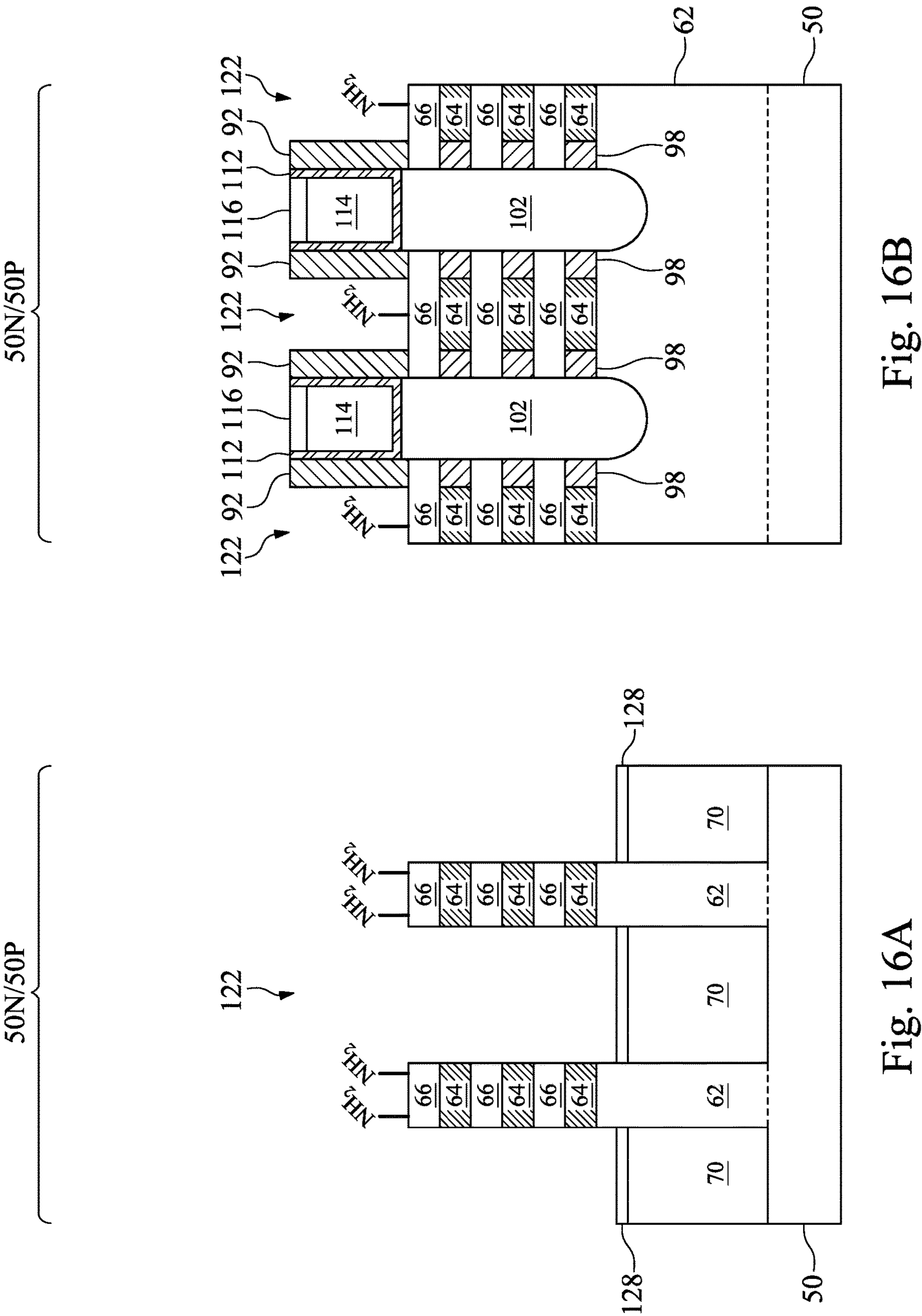

In FIGS. 16A-16B, protection layers 128 are formed on the top surfaces of the isolation regions 70. The protection layers 128 are formed by selectively depositing a protection material on the top surfaces of the isolation regions 70. The protection material may be a carbon-containing dielectric material, such as silicon oxycarbonitride, silicon carbonitride, or the like, which may be deposited by a selective deposition process such as a selective ALD process, a selective CVD process, or the like. The protection material may be doped with impurities, such as hydrogen. The protection material of the protection layers 128 is different from the insulation material of the isolation regions 70. For example, the protection material of the protection layers 128 may have a greater carbon concentration than the insulation material of the isolation regions 70.

As subsequently described in greater detail, the dummy nanostructures 64 will be replaced with corresponding gate structures. The protection layers 128 will protect the isolation regions 70 during the removal of the dummy nanostructures 64. Specifically, the protection material of the protection layers 128 has a high etching selectivity from the dummy material of the dummy nanostructures 64. Accordingly, etching losses of the isolation regions 70 during the subsequent gate replacement process may be reduced. In some embodiments, the protection layers 128 are formed to a thickness in the range of 0 Å to 100 Å. Such a thickness of the protection layers 128 may help provide protection to the isolation regions 70 during the removal of the dummy nanostructures 64. In some embodiments, the composition of the protection material includes from 30% to 50% silicon, from 10% to 20% carbon, and from 0% to 10% nitrogen, where the ratio of carbon to silicon is in the range of 0.3 to 0.5 (such as in the range of 0.3 to 0.4). Such a composition of the protection material may cause it to have a low etching rate during the removal of the dummy nanostructures 64. In some embodiments, the etching rate of the protection material with dilute hydrofluoric (dHF) acid is less than 10 Å/minute. The etching rate of the protection material may be tuned to a desired amount by adjusting the composition of the protection material.

In some embodiments, the protection layers 128 are formed by a selective ALD process, which is performed by cyclically dispensing different source precursors in the recesses 122. The source precursors include a silicon-carbon precursor and one or more other precursor(s) that react with the silicon-carbon precursor to form the protection material of the protection layers 128. The silicon-carbon precursor is a precursor that includes both silicon and carbon, such as bis(tertiary-butyl-amino)silane (BTBAS), bis(diethylamino) silane (BDEAS), or the like. The other precursor(s) may be precursor(s) that include nitrogen and/or oxygen, such as oxygen gas, ammonia, or the like. An ALD cycle is performed by sequentially dispensing each of the source precursors, with each ALD cycle resulting in the deposition of an atomic layer (sometimes called a monolayer) of the protection material of the protection layers 128. The ALD cycle is repeated a number of times until the protection layers 128 are formed to a desired thickness (previously described). The selective ALD process may be plasma-enhanced, where a plasma is generated after at least some of the source precursor(s) are dispensed. The plasma may be generated from argon, helium, oxygen, combinations thereof, or the like, which is excited into a plasma state using a plasma generator. During an ALD cycle of the selective ALD process, the top surfaces of the isolation regions 70 are soaked in the silicon-carbon precursor. The process conditions of the selective ALD process (e.g., temperature, pressure, and plasma generation) are selected such that the hydrogen atoms in the hydroxyl groups are broken off. As a result, silicon atoms in the silicon-carbon precursor are adsorbed on, and are attached to, the oxygen atoms remaining from the hydroxyl groups. The silicon-carbon precursor prefers to attach to hydroxyl groups, and does not prefer to attach to amino groups. Accordingly, the amino groups act as an inhibitor for inhibiting the physical and/or chemical adsorption of the silicon-carbon precursor. Effectively, the treatment process 124 (previously described for FIGS. 15A-15B) increases the deposition selectivity between the top surfaces of the upper semiconductor nanostructures 66 and the top surfaces of the isolation regions 70, relative the selective ALD process. Since hydroxyl groups dangle from the top surfaces of the isolation regions 70 and amino groups dangle from the top surfaces of the upper semiconductor nanostructures 66, the silicon-carbon precursor is attached to the isolation regions 70 but is inhibited from attaching to the semiconductor nanostructures 66. Accordingly, the adsorption of the silicon-carbon precursor is selective to the isolation regions 70, and the protection material of the protection layers 128 is selectively deposited on the top surfaces of the isolation regions 70. The top surfaces of the upper semiconductor nanostructures 66 may be substantially free from the protection layers 128. Additionally, the top surfaces of the upper semiconductor nanostructures 66 may be substantially free from carbon after the protection layer 128 is deposited. Forming the dangling amino groups on the semiconductor nanostructures 66 is a low-cost way to avoid formation of the protection layers 128 on the semiconductor nanostructures 66.

Figures 17A, 17B:
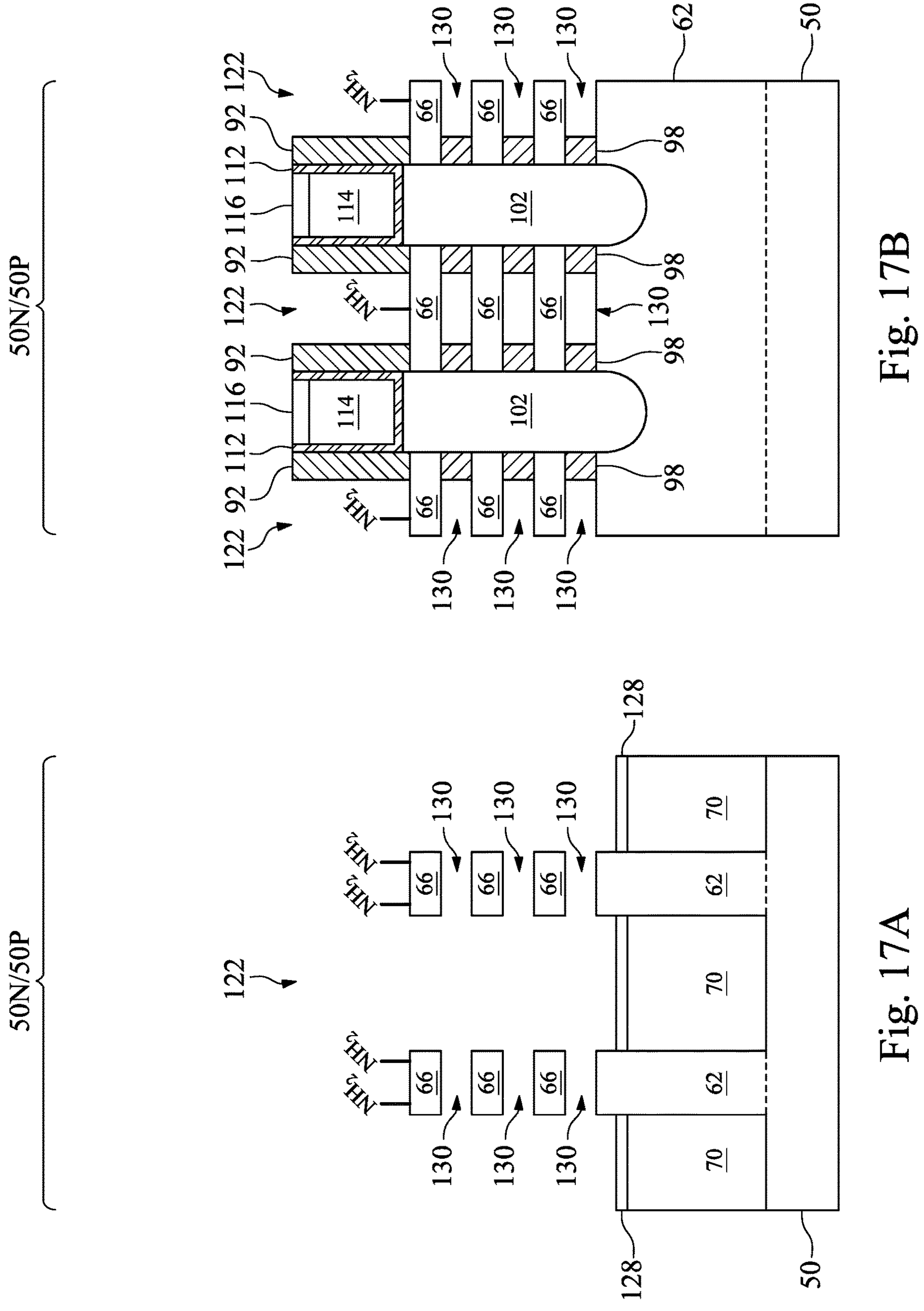

In FIGS. 17A-17B, the remaining portions of the dummy nanostructures 64 are removed to form openings 130 in regions between the semiconductor nanostructures 66. The remaining portions of the dummy nanostructures 64 can be removed by any acceptable etch process that selectively etches the material of the dummy nanostructures 64 at a faster rate than the materials of the semiconductor nanostructures 66 and the protection layers 128. The etching may be isotropic. For example, when the dummy nanostructures 64 are formed of silicon-germanium, the semiconductor nanostructures 66 are formed of silicon, and the protection layers 128 are formed of silicon oxycarbonitride, the etch process may be a wet etch using tetramethylammonium hydroxide (TMAH), ammonium hydroxide ($NH_4OH$), or the like. Similarly, when the dummy nanostructures 64 are formed of silicon oxide, the semiconductor nanostructures 66 are formed of silicon, and the protection layers 128 are formed of silicon oxycarbonitride, the etch process may be a wet etch using dilute hydrofluoric (dHF) acid or the like. The protection layers 128 protect the isolation regions 70 during the etching of the dummy nanostructures 64, thereby reducing etching losses of the isolation regions 70. In some embodiments, the isolation regions 70 and the dummy nanostructures 64 are formed of the same material, and forming the protection layers 128 allows the dummy nanostructures 64 to be removed without removing the isolation regions 70.

Figures 18A, 18B:
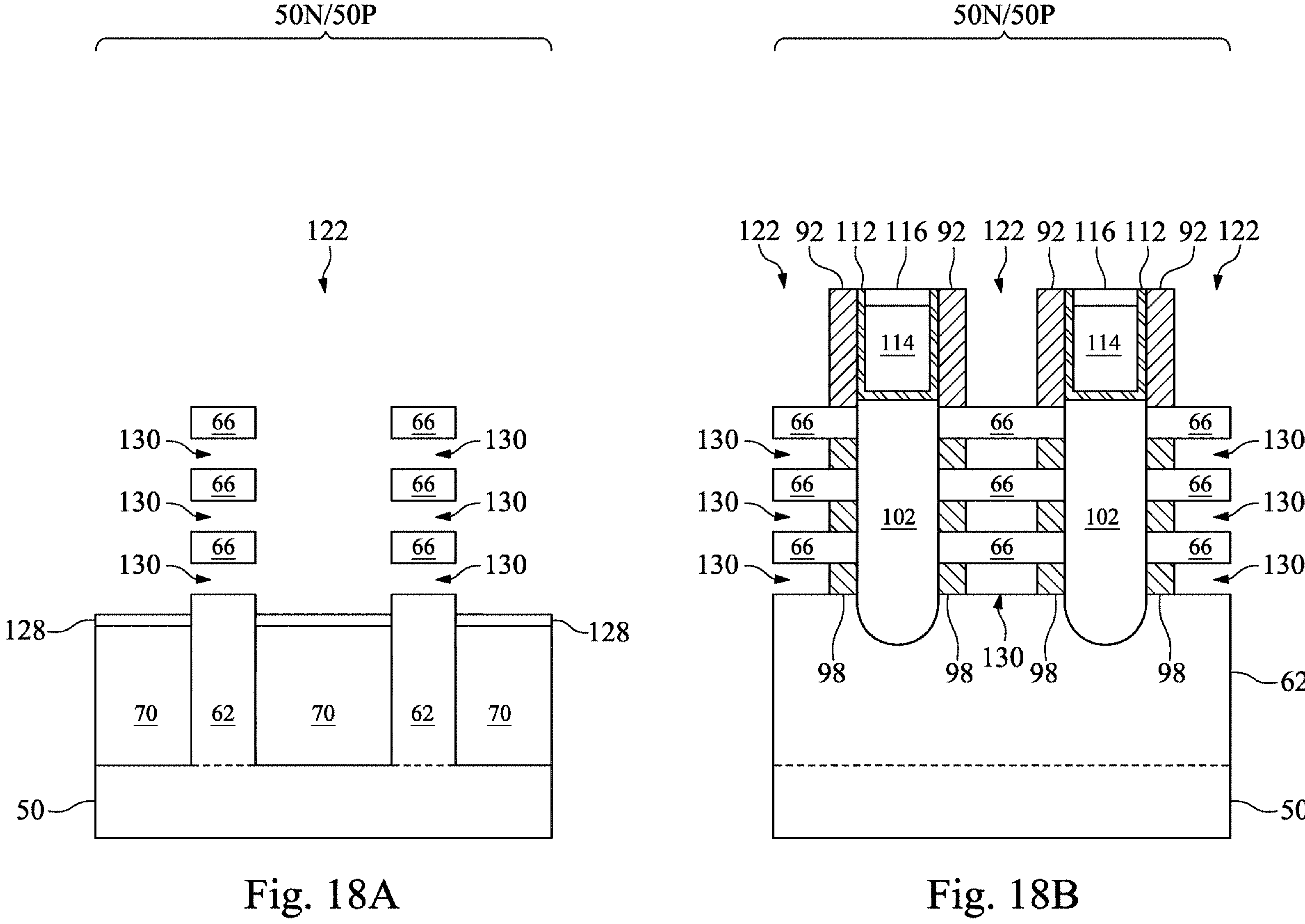

In FIGS. 18A-18B, the dangling amino groups are removed, e.g., from the surfaces of the semiconductor nanostructures 66. The dangling amino groups can be removed by any acceptable etch process (such as a dry etch and/or a wet etch) that selectively etches the dangling amino groups at a faster rate than the materials of the semiconductor nanostructures 66 and the protection layers 128. In some embodiments, the dangling amino groups are removed by the same etching process as that used to remove the remaining portions of the dummy nanostructures 64. In some embodiments, the dangling amino groups are removed by a separate etching process that is performed after the etching process used to remove the remaining portions of the dummy nanostructures 64.

The dangling amino groups may be easier to etch than the protection material of the protection layers 128. By avoiding formation of the protection layers 128 on the semiconductor nanostructures 66, they may be more easily exposed after the deposition of the protection layers 128. Over-etching of the semiconductor nanostructures 66 may thus be avoided, improving device reliability.

Figures 19A, 19B:
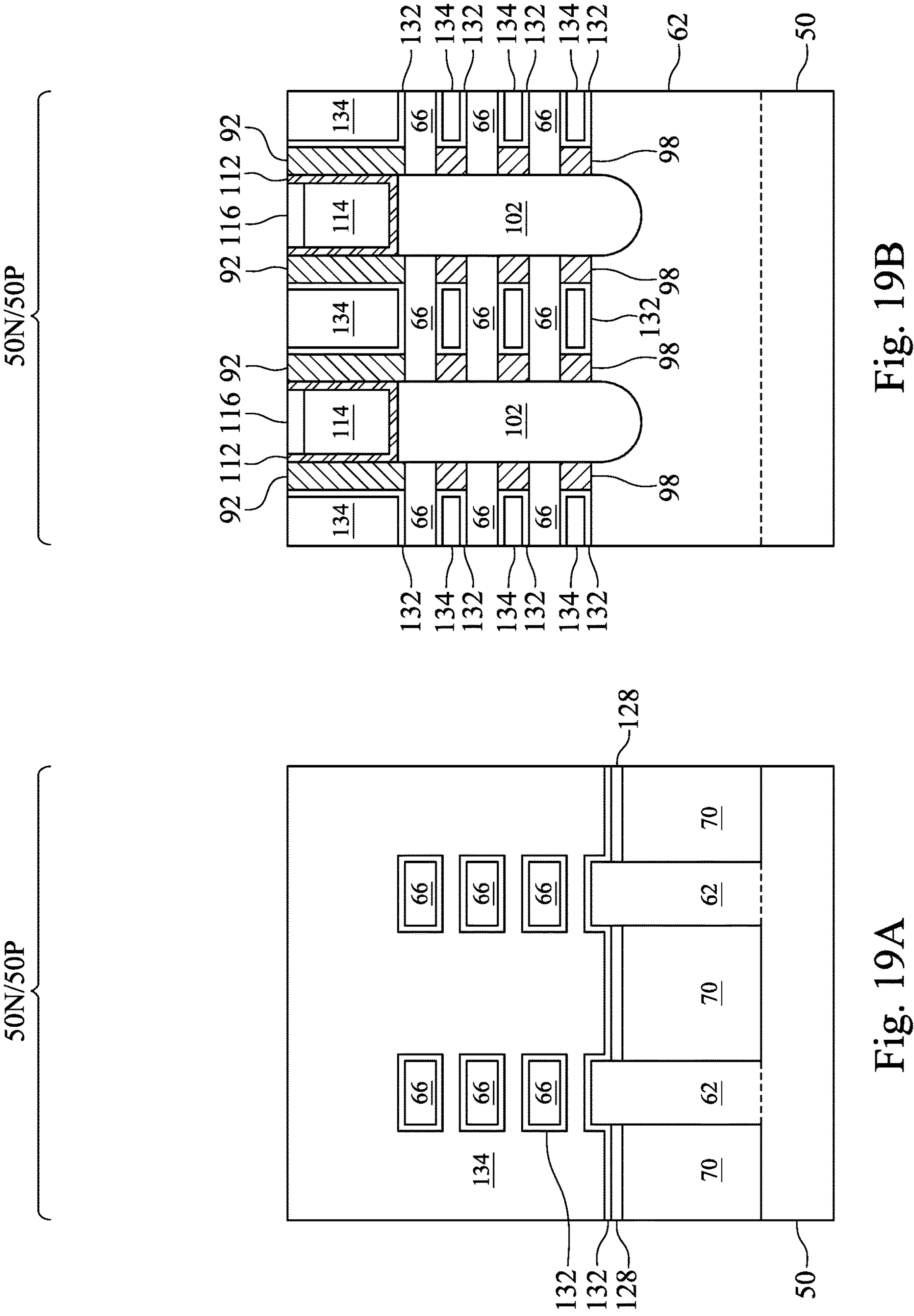
Figures 20A, 20B:
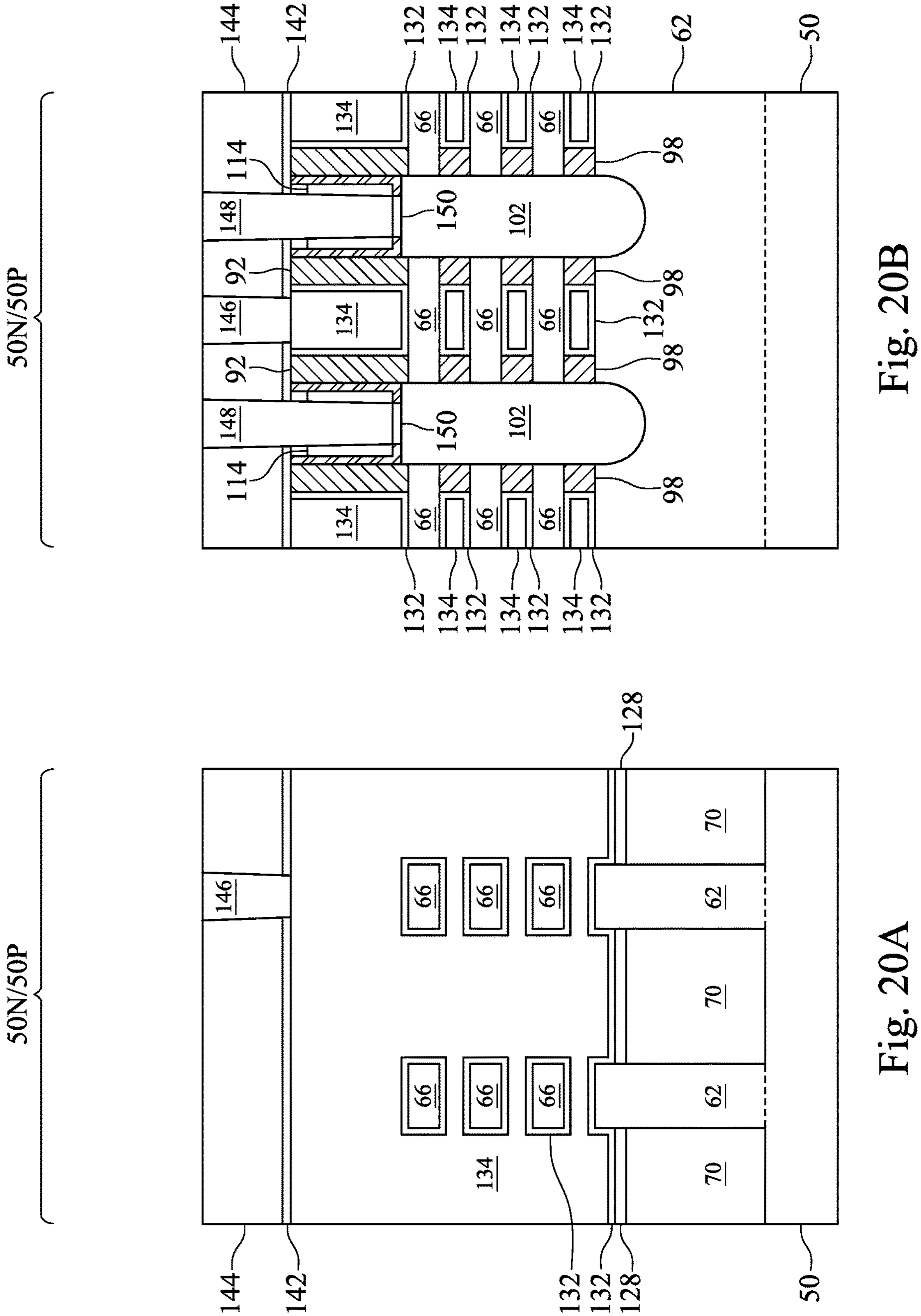

In FIGS. 19A-19B, gate dielectrics 132 and gate electrodes 134 are formed for replacement gates. Each respective pair of a gate dielectric 132 and a gate electrode 134 may be collectively referred to as a "gate structure." Each gate structure is wrapped around a channel region of a semiconductor nanostructure 66, such that the gate structure extends along sidewalls, a bottom surface, and a top surface of the semiconductor nanostructure 66. Some of the gate structures also extend along sidewalls and/or a top surface of a semiconductor fin 62.

The gate dielectrics 132 include one or more gate dielectric layer(s) disposed on the sidewalls and/or the top surfaces of the semiconductor fins 62; on the top surfaces, the sidewalls, and the bottom surfaces of the channel regions of the semiconductor nanostructures 66; on the sidewalls of the inner spacers 98; and on the sidewalls of the gate spacers 92. The gate dielectrics 132 may be formed of an oxide such as silicon oxide or a metal oxide, a silicate such as a metal silicate, combinations thereof, multi-layers thereof, or the like. Additionally or alternatively, the gate dielectrics 132 may be formed of a high-k dielectric material (e.g., dielectric materials having a k-value greater than about 7.0), such as a metal oxide or a silicate of hafnium, aluminum, zirconium, lanthanum, manganese, barium, titanium, lead, and combinations thereof. The dielectric material(s) of the gate dielectrics 132 may be formed by molecular-beam deposition (MBD), ALD, PECVD, or the like. Although single-layered gate dielectrics 132 are illustrated, the gate dielectrics 132 may include any number of interfacial layers and any number of main layers. For example, the gate dielectrics 132 may include an interfacial layer and an overlying high-k dielectric layer.

The gate electrodes 134 include one or more gate electrode layer(s) disposed over the gate dielectrics 132. The gate electrodes 134 may be formed of a metal-containing material such as titanium nitride, titanium oxide, tantalum nitride, tantalum carbide, tungsten, cobalt, ruthenium, aluminum, combinations thereof, multi-layers thereof, or the like. Although single-layered gate electrodes 134 are illustrated, the gate electrodes 134 may include any number of work function tuning layers, any number of barrier layers, any number of glue layers, and a fill material.

As an example to form the gate structures, one or more gate dielectric layer(s) may be deposited in the recesses 122 and the openings 130. The gate dielectric layer(s) may also be deposited on the top surfaces of the gate spacers 92 and the ILD masks 116 (if present) or the first ILD 114. Subsequently, one or more gate electrode layer(s) may be deposited on the gate dielectric layer(s), and in the remaining portions of the recesses 122 and the openings 130. A removal process may then be performed to remove the excess portions of the gate dielectric layer(s) and the gate electrode layer(s), which excess portions are over the top surfaces of the gate spacers 92 and the ILD masks 116 (if present) or the first ILD 114. In some embodiments, a planarization process such as a chemical mechanical polish (CMP), an etch-back process, combinations thereof, or the like may be utilized. The gate dielectric layer(s), after the removal process, have portions remaining in the recesses 122 and the openings 130 (thus forming the gate dielectrics 132). The gate electrode layer(s), after the removal process, have portions remaining in the recesses 122 and the openings 130 (thus forming the gate electrodes 134). When a planarization process it utilized, the top surfaces of the gate spacers 92, the ILD masks 116 (if present) or the first ILD 114, the gate dielectrics 132, and the gate electrodes 134 are substantially coplanar (within process variations).

In FIGS. 20A-20B, a second ILD 144 is deposited over the gate spacers 92, the ILD masks 116 (if present) or the first ILD 114, the gate dielectrics 132, and the gate electrodes 134. In some embodiments, the second ILD 144 is a flowable film formed by a flowable CVD method. In some embodiments, the second ILD 144 is formed of a dielectric material such as PSG, BSG, BPSG, USG, or the like, which may be formed by any suitable deposition process, such as CVD, PECVD, or the like.

In some embodiments, an etch stop layer (ESL) 142 is formed between the second ILD 144 and the gate spacers 92, the ILD masks 116 (if present) or the first ILD 114, the gate dielectrics 132, and the gate electrodes 134. The ESL 142 may be formed of a dielectric material having a high etching selectivity from the etching of the second ILD 144, such as silicon nitride, silicon oxynitride, or the like, which may be formed by any suitable deposition process, such as CVD, ALD, or the like.

Gate contacts 146 and source/drain contacts 148 are formed through the second ILD 144 and the first ILD 114 to electrically couple to, respectively, the gate electrodes 134 and the epitaxial source/drain regions 102. As an example to form the gate contacts 146 and the source/drain contacts 148, openings for the gate contacts 146 are formed through the second ILD 144 and the ESL 142, and openings for the source/drain contacts 148 are formed through the second ILD 144, the ESL 142, the ILD masks 116 (if present), the first ILD 114, and the CESL 112. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be cobalt, tungsten, copper, a copper alloy, silver, gold, aluminum, nickel, or the like. A planarization process, such as a CMP, may be performed to remove excess material from the top surface of the second ILD 144. The remaining liner and conductive material form the gate contacts 146 and the source/drain contacts 148 in the openings. The gate contacts 146 and the source/drain contacts 148 may be formed in distinct processes, or may be formed in the same process. Although shown as being formed in the same cross-section, it should be appreciated that each of the gate contacts 146 and the source/drain contacts 148 may be formed in different cross-sections, which may avoid shorting of the contacts.

Optionally, metal-semiconductor alloy regions 150 are formed at the interfaces between the epitaxial source/drain regions 102 and the source/drain contacts 148. The metal-semiconductor alloy regions 150 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 150 can be formed before the material(s) of the source/drain contacts 148 by depositing a metal in the openings for the source/drain contacts 148 and then performing a thermal anneal process. The metal can be any metal capable of reacting with the semiconductor materials (e.g., silicon, silicon-germanium, germanium, etc.) of the epitaxial source/drain regions 102 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the source/drain contacts 148, such as from surfaces of the metal-semiconductor alloy regions 150. The material(s) of the source/drain contacts 148 can then be formed on the metal-semiconductor alloy regions 150.

In the previously described embodiments, the semiconductor layers 56 (see FIG. 2) are patterned to form the channel regions in both the n-type region 50N and the p-type region 50P. In another embodiment (not separately illustrated), different sets of semiconductor layers are patterned to form the channel regions in the n-type region 50N and the p-type region 50P. For example, the multi-layer stack 52 (previously described for FIG. 2) may include alternating first and second semiconductor layers formed of the first and second semiconductor materials, respectively. First and second nanostructures are formed in the multi-layer stack 52, by a similar process as previously described for FIG. 3. The first semiconductor material of the first nanostructures may be suitable for p-type devices, while the second semiconductor material of the second nanostructures may be suitable for n-type devices. The first semiconductor material and the second semiconductor material may have a high etching selectivity from the etching of one another, so that the first nanostructures may be removed without significantly removing the second nanostructures in the n-type region 50N, and the second nanostructures may be removed without significantly removing the first nanostructures in the p-type region 50P. The inner spacers 98 in the n-type region 50N are formed on the sidewalls of the first nanostructures while the inner spacers 98 in the p-type region 50P are formed on the sidewalls of the second nanostructures, by a similar process as previously described for FIGS. 9A-9B. The gate structures (including the gate dielectrics 132 and the gate electrodes 134) in the p-type region 50P are formed around the first nanostructures while the gate structures in the n-type region 50N are formed around the second nanostructures, by a similar process as previously described for FIGS. 14A-19B. Various masking steps may be used to mask and expose appropriate regions when forming the inner spacers 98 and the gate structures.

Figures 21A, 21B:
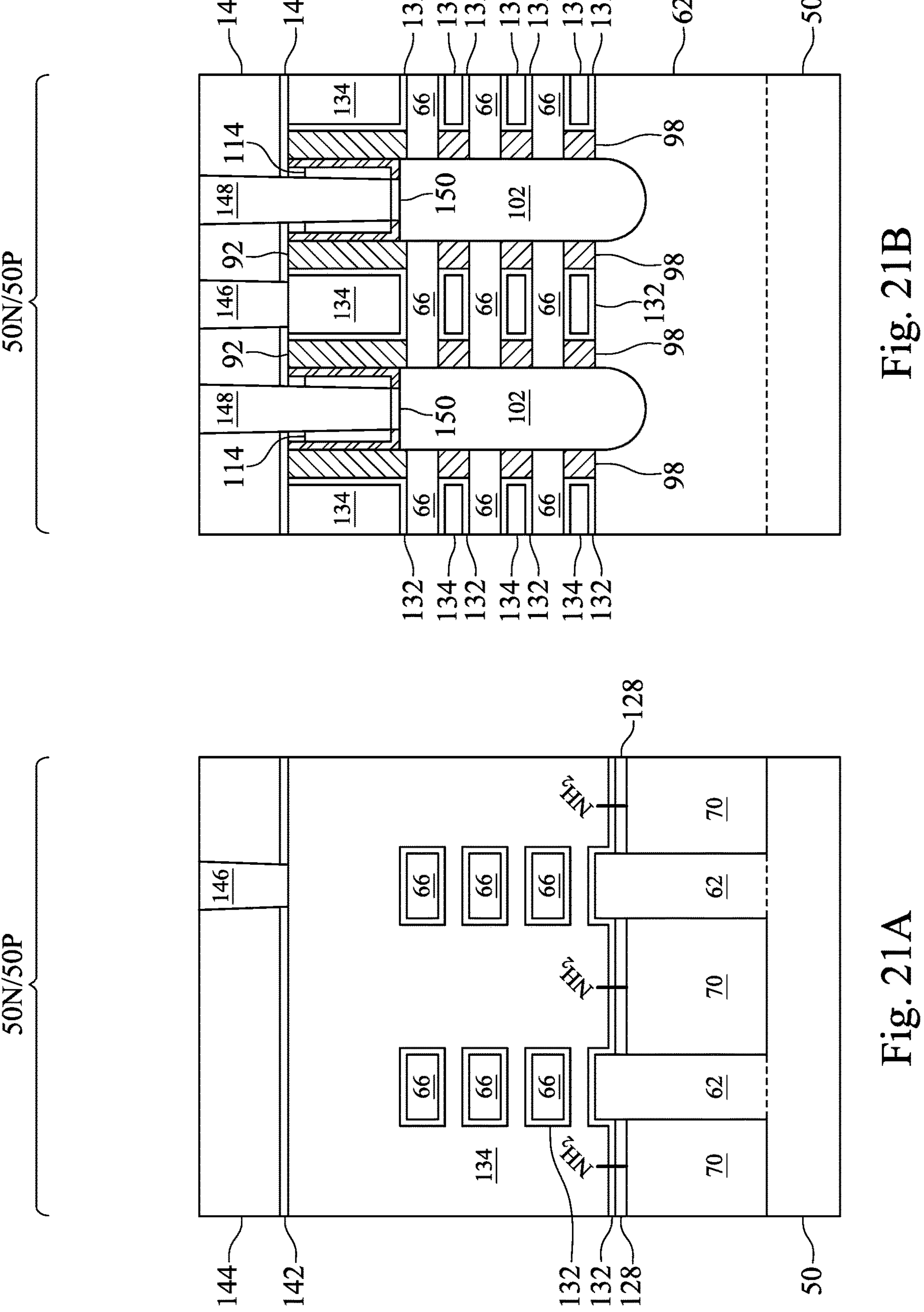
FIGS. 21A-21B are views of nanostructure-FETs, in accordance with some other embodiments.

FIGS. 21A-21B are views of nanostructure-FETs, in accordance with some other embodiments. This embodiment is similar to the embodiment of FIGS. 20A-20B, except there are some amino groups dangling from the top surfaces of the isolation regions 70. Accordingly, the protection layers 128 are formed over and cover those amino groups, which remain dangling and unreacted with the protection material of the protection layers 128.

Other functional groups may be utilized. More generally, any first functional groups may be formed dangling from the top surfaces of the upper semiconductor nanostructures 66 and the top surfaces of the isolation regions 70. The treatment process 124 may then be performed to selectively replace some of the first functional groups with second functional groups. The protection layers 128 may then be formed by a selective deposition process which prefers to attach to the first functional groups, and does not prefer to attach to the second functional groups. Accordingly, replacing at least some of the first functional groups with the second functional groups effectively increases the deposition selectivity between the top surfaces of the upper semiconductor nanostructures 66 and the top surfaces of the isolation regions 70, relative the selective deposition process.

Figures 22A, 22B:
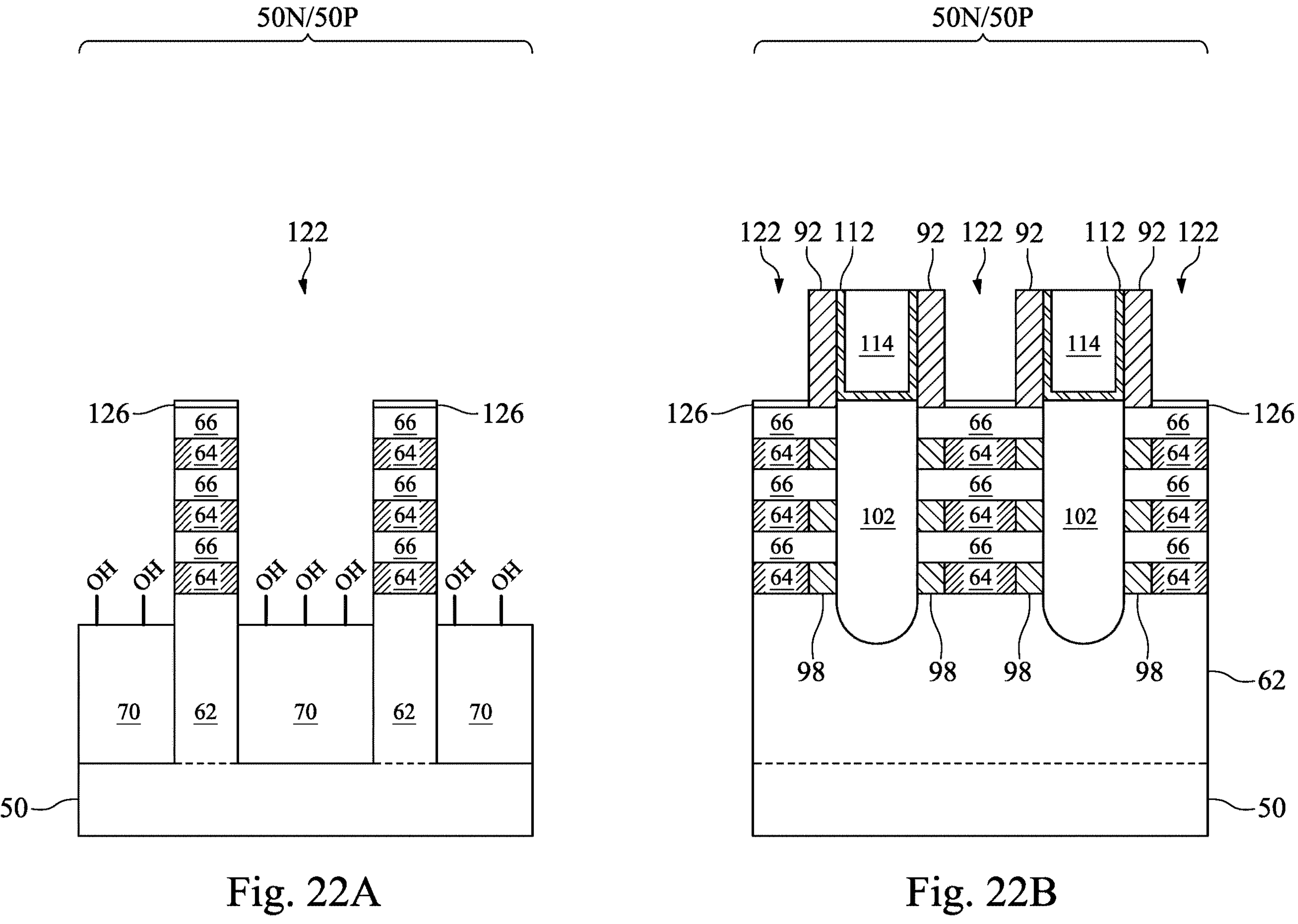
Figures 23A, 23B:
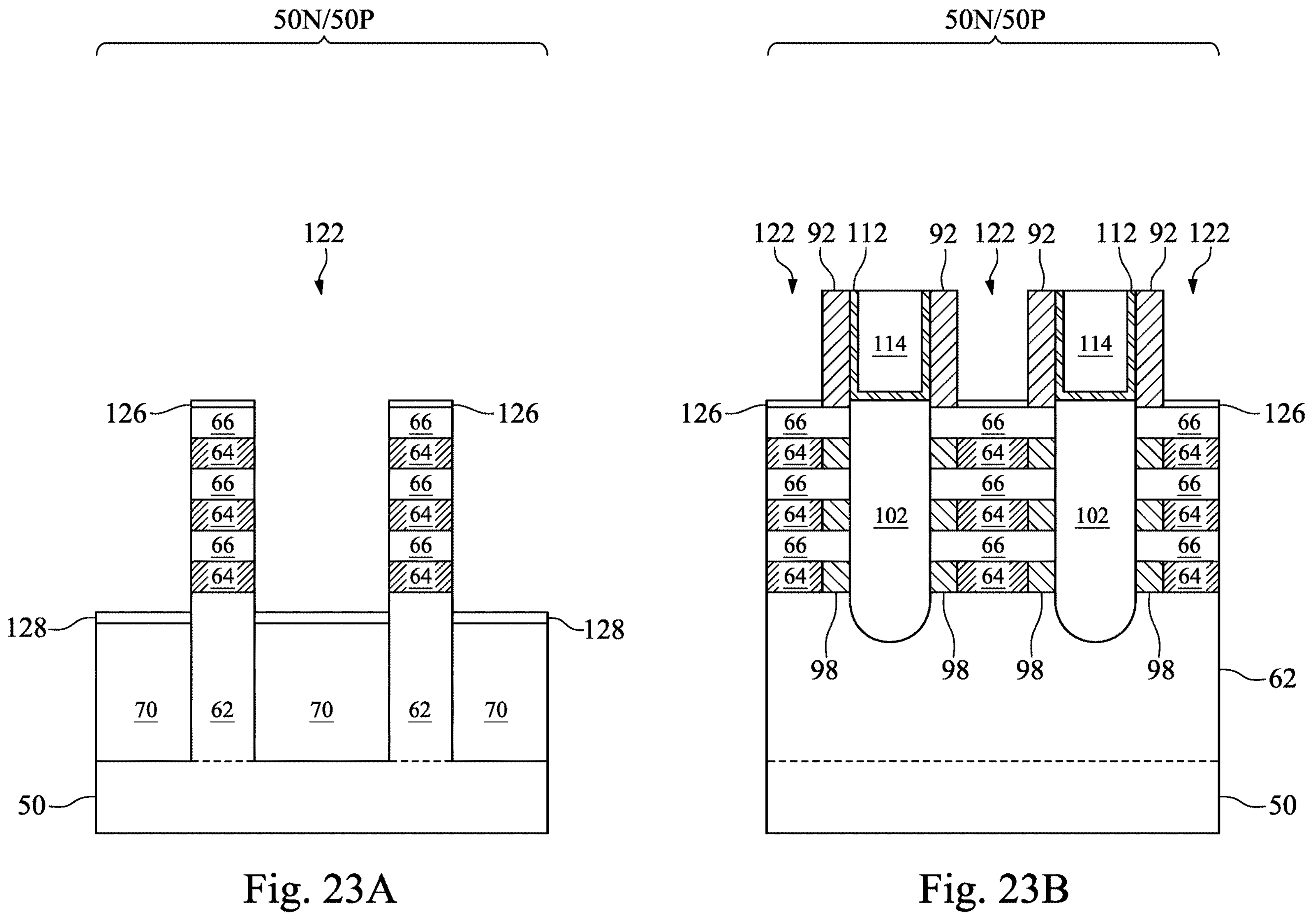

FIGS. 22A-23B are views of intermediate stages in the manufacturing of nanostructure-FETs, in accordance with some other embodiments. FIGS. 22A and 23A illustrate cross-sectional views along a similar cross-section as reference cross-section A-A' in FIG. 1. FIGS. 22B and 23B illustrate cross-sectional views along a similar cross-section as reference cross-section B-B' in FIG. 1.

In FIGS. 22A-22B, similar steps as those previously described are performed to form the structure of FIGS. 14A-14B. In this embodiment, inhibition layers 126 are deposited on the top surfaces of the upper semiconductor nanostructures 66, in lieu of performing the treatment process 124. The inhibition layers 126 cover (e.g., passivate) the hydroxyl groups on the top surfaces of the upper semiconductor nanostructures 66. The inhibition layers 126 may be formed of a dielectric material such as silicon nitride, silicon oxynitride, or the like, which may be deposited by a selective deposition process such as a selective ALD process, a selective CVD process, or the like. The inhibition layers 126 may not be deposited on the isolation regions 70.

In FIGS. 23A-23B, protection layers 128 are formed on the top surfaces of the isolation regions 70. The protection layers 128 are formed by selectively depositing a protection material on the top surfaces of the isolation regions 70, in a similar manner as previously described for FIGS. 16A-16B. The top surfaces of the inhibition layers 126 may be substantially free from hydroxyl groups, and thus the selective deposition process for forming the protection material does not prefer the inhibition layers 126. Effectively, forming the inhibition layers 126 increases the deposition selectivity between the top surfaces of the upper semiconductor nanostructures 66 and the top surfaces of the isolation regions 70, relative the selective deposition process. The protection layers 128 may not be deposited on the inhibition layers 126.

Subsequently, similar steps as those previously described are performed to complete the manufacturing of the nanostructure-FETs. The inhibition layers 126 may be removed before the gate structures are formed around the semiconductor nanostructures 66. The inhibition layers 126 can be removed by any acceptable etch process (such as a dry etch and/or a wet etch) that selectively etches the material of the inhibition layers 126 at a faster rate than the materials of the semiconductor nanostructures 66 and the protection layers 128. In some embodiments, the inhibition layers 126 are removed by the same etching process as that used to remove the remaining portions of the dummy nanostructures 64 (previously described for FIGS. 17A-17B). In some embodiments, the inhibition layers 126 are removed by a separate etching process that is performed after the etching process used to remove the remaining portions of the dummy nanostructures 64.

Embodiments may achieve advantages. Forming the dangling amino groups or the inhibition layers 126 on the top surfaces of the upper semiconductor nanostructures 66 increases the selectivity of the process used to selectively deposit the protection layers 128. Specifically, the dangling amino groups or the inhibition layers 126 inhibit deposition of the protection layers 128 on the top surfaces of the upper semiconductor nanostructures 66. Accordingly, the top surfaces of the upper semiconductor nanostructures 66 may be more easily exposed in subsequent processing before the gate structures are formed around the semiconductor nanostructures 66. Over-etching of the semiconductor nanostructures 66 may thus be avoided, improving device reliability.

In an embodiment, a method includes: exposing a semiconductor nanostructure, a dummy nanostructure, and an isolation region by removing a dummy gate; increasing a deposition selectivity between a top surface of the semiconductor nanostructure and a top surface of the isolation region relative a selective deposition process; depositing a protection layer on the top surface of the isolation region by performing the selective deposition process; removing the dummy nanostructure by selectively etching a dummy material of the dummy nanostructure at a faster rate than a protection material of the protection layer; and forming a gate structure around the semiconductor nanostructure. In some embodiments of the method, hydroxyl groups dangle from the top surface of the semiconductor nanostructure and from the top surface of the isolation region, and increasing the deposition selectivity between the top surface of the semiconductor nanostructure and the top surface of the isolation region includes: replacing the hydroxyl groups dangling from the top surface of the semiconductor nanostructure with amino groups. In some embodiments of the method, replacing the hydroxyl groups includes: soaking the semiconductor nanostructure in a nitrogen-containing gas without generating a plasma. In some embodiments of the method, replacing the hydroxyl groups includes: bombarding the semiconductor nanostructure with nitrogen-containing ions. In some embodiments of the method, increasing the deposition selectivity between the top surface of the semiconductor nanostructure and the top surface of the isolation region includes: depositing an inhibition layer on the top surface of the semiconductor nanostructure. In some embodiments of the method, hydroxyl groups dangle from the top surface of the isolation region, and depositing the protection layer includes: soaking the isolation region in a silicon-carbon precursor that adsorbs on oxygen atoms of the hydroxyl groups. In some embodiments of the method, the dummy nanostructure is formed of silicon-germanium, the semiconductor nanostructure is formed of silicon, the protection layer is formed of silicon oxycarbonitride, and removing the dummy nanostructure includes etching the dummy nanostructure with tetramethylammonium hydroxide or ammonium hydroxide. In some embodiments of the method, the dummy nanostructure is formed of silicon oxide, the semiconductor nanostructure is formed of silicon, the protection layer is formed of silicon oxycarbonitride, and removing the dummy nanostructure includes etching the dummy nanostructure with dilute hydrofluoric acid.

In an embodiment, a method includes: exposing a semiconductor nanostructure and an isolation region by removing a dummy gate, where hydroxyl groups dangle from a top surface of the semiconductor nanostructure and from a top surface of the isolation region; performing a treatment process to selectively replace some of the hydroxyl groups with amino groups that dangle from the top surface of the semiconductor nanostructure; depositing a protection layer on the top surface of the isolation region using a silicon-carbon precursor that reacts with the hydroxyl groups and does not react with the amino groups, the top surface of the semiconductor nanostructure being substantially free from carbon after the protection layer is deposited; and removing the amino groups that dangle from the top surface of the semiconductor nanostructure. In some embodiments of the method, the treatment process includes: soaking the semiconductor nanostructure in ammonia or nitrogen gas without generating a plasma. In some embodiments of the method, the treatment process includes: bombarding the semiconductor nanostructure with nitrenium ions or nitrogen ions. In some embodiments of the method, the top surface of the isolation region is substantially free from amino groups after the treatment process. In some embodiments of the method, amino groups dangle from the top surface of the isolation region after the treatment process. In some embodiments of the method, the silicon-carbon precursor is bis(tertiary-butyl-amino)silane or bis(diethylamino)silane.

In an embodiment, a device includes: a source/drain region; a semiconductor nanostructure adjacent the source/drain region; an isolation region adjacent the semiconductor nanostructure, the isolation region including a first dielectric material; a protection layer on the isolation region, the protection layer including a second dielectric material, the second dielectric material including more carbon than the first dielectric material; a gate structure on the protection layer and around the semiconductor nanostructure; and a spacer between the gate structure and the source/drain region, the spacer electrically isolating the gate structure from the source/drain region, the spacer physically contacting the semiconductor nanostructure. In some embodiments of the device, the second dielectric material is silicon oxycarbonitride or silicon carbonitride. In some embodiments of the device, the second dielectric material is doped with hydrogen. In some embodiments of the device, the protection layer is on a top surface of the isolation region, and the top surface of the isolation region is substantially free from amino groups. In some embodiments of the device, the protection layer is on a top surface of the isolation region, and amino groups dangle from the top surface of the isolation region. In some embodiments of the device, the second dielectric material has a ratio of carbon to silicon in a range of 0.3 to 0.5.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

exposing a semiconductor nanostructure, a dummy nanostructure, and an isolation region by removing a dummy gate;

increasing a deposition selectivity between a top surface of the semiconductor nanostructure and a top surface of the isolation region relative a selective deposition process;

depositing a protection layer on the top surface of the isolation region by performing the selective deposition process;

removing the dummy nanostructure by selectively etching a dummy material of the dummy nanostructure at a faster rate than a protection material of the protection layer; and forming a gate structure around the semiconductor nanostructure.

2. The method of claim 1, wherein hydroxyl groups dangle from the top surface of the semiconductor nanostructure and from the top surface of the isolation region, and increasing the deposition selectivity between the top surface of the semiconductor nanostructure and the top surface of the isolation region comprises:

replacing the hydroxyl groups dangling from the top surface of the semiconductor nanostructure with amino groups.

3. The method of claim 2, wherein replacing the hydroxyl groups comprises:

soaking the semiconductor nanostructure in a nitrogen-containing gas without generating a plasma.

4. The method of claim 2, wherein replacing the hydroxyl groups comprises:

bombarding the semiconductor nanostructure with nitrogen-containing ions.

5. The method of claim 1, wherein increasing the deposition selectivity between the top surface of the semiconductor nanostructure and the top surface of the isolation region comprises:

depositing an inhibition layer on the top surface of the semiconductor nanostructure.

6. The method of claim 1, wherein hydroxyl groups dangle from the top surface of the isolation region, and depositing the protection layer comprises:

soaking the isolation region in a silicon-carbon precursor that adsorbs on oxygen atoms of the hydroxyl groups.

7. The method of claim 1, wherein the dummy nanostructure is formed of silicon-germanium, the semiconductor nanostructure is formed of silicon, the protection layer is formed of silicon oxycarbonitride, and removing the dummy nanostructure comprises etching the dummy nanostructure with tetramethylammonium hydroxide or ammonium hydroxide.

8. The method of claim 1, wherein the dummy nanostructure is formed of silicon oxide, the semiconductor nanostructure is formed of silicon, the protection layer is formed of silicon oxycarbonitride, and removing the dummy nanostructure comprises etching the dummy nanostructure with dilute hydrofluoric acid.

9. A method comprising:

exposing a semiconductor nanostructure and an isolation region by removing a dummy gate, wherein hydroxyl groups dangle from a top surface of the semiconductor nanostructure and from a top surface of the isolation region;

performing a treatment process to selectively replace some of the hydroxyl groups with amino groups that dangle from the top surface of the semiconductor nanostructure;

depositing a protection layer on the top surface of the isolation region using a silicon-carbon precursor that reacts with the hydroxyl groups and does not react with the amino groups, the top surface of the semiconductor nanostructure being substantially free from carbon after the protection layer is deposited; and removing the amino groups that dangle from the top surface of the semiconductor nanostructure.

10. The method of claim 9, wherein the treatment process comprises:

soaking the semiconductor nanostructure in ammonia or nitrogen gas without generating a plasma.

11. The method of claim 9, wherein the treatment process comprises:

bombarding the semiconductor nanostructure with nitrenium ions or nitrogen ions.

12. The method of claim 9, wherein the top surface of the isolation region is substantially free from amino groups after the treatment process.

13. The method of claim 9, wherein amino groups dangle from the top surface of the isolation region after the treatment process.

14. The method of claim 9, wherein the silicon-carbon precursor is bis(tertiary-butyl-amino)silane or bis(diethylamino) silane.

15. A method comprising:

exposing a semiconductor nanostructure, a dummy nanostructure, and an isolation region by removing a dummy gate, wherein hydroxyl groups dangle from a top surface of the semiconductor nanostructure and from a top surface of the isolation region;

increasing a deposition selectivity between the top surface of the semiconductor nanostructure and the top surface of the isolation region relative a selective deposition process, wherein increasing the deposition selectivity comprises performing a treatment process to selectively replace some of the hydroxyl groups with amino groups that dangle from the top surface of the semiconductor nanostructure;

depositing a protection layer on the top surface of the isolation region by performing the selective deposition process, wherein the selective deposition process comprises using a silicon-carbon precursor that reacts with the hydroxyl groups and does not react with the amino groups, the top surface of the semiconductor nanostructure being substantially free from carbon after the protection layer is deposited;

removing the dummy nanostructure by selectively etching a dummy material of the dummy nanostructure at a faster rate than a protection material of the protection layer;

removing the amino groups that dangle from the top surface of the semiconductor nanostructure; and forming a gate structure around the semiconductor nanostructure.

16. The method of claim 15, wherein the treatment process comprises soaking the semiconductor nanostructure in ammonia or nitrogen gas without generating a plasma, and wherein the soaking is performed at a temperature in a range of 400° C. to 800° C. and for a duration in a range of 4 hours to 8 hours.

17. The method of claim 15, wherein the treatment process comprises bombarding the semiconductor nanostructure with nitrenium ions or nitrogen ions, and wherein the bombarding is performed using a plasma generation power having a high power in a range of 200 watts to 800 watts.

18. The method of claim 15, wherein the amino groups are removed by a same etching process as that used to remove the dummy nanostructure.

19. The method of claim 15, wherein the amino groups are removed by a separate etching process that is performed after removing the dummy nanostructure.

20. The method of claim 15, wherein the hydroxyl groups are formed on the top surface of the semiconductor nanostructure and on the top surface of the isolation region by a surface hydroxylation process performed after removing the dummy gate, and wherein the surface hydroxylation process is a plasma treatment performed with oxygen and hydrogen.

* * * * *